United States Patent
Manning et al.

(10) Patent No.: US 10,074,407 B2
(45) Date of Patent: Sep. 11, 2018

(54) APPARATUSES AND METHODS FOR PERFORMING INVERT OPERATIONS USING SENSING CIRCUITRY

(71) Applicant: Micron Technology, Inc., Boise, ID (US)

(72) Inventors: Troy A. Manning, Meridian, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/724,366

(22) Filed: May 28, 2015

(65) Prior Publication Data

US 2015/0357008 A1    Dec. 10, 2015

Related U.S. Application Data

(60) Provisional application No. 62/008,064, filed on Jun. 5, 2014.

(51) Int. Cl.
| | | |
|---|---|---|
| G11C 7/08 | (2006.01) | |
| G11C 7/06 | (2006.01) | |
| G11C 7/10 | (2006.01) | |
| G11C 11/409 | (2006.01) | |
| G11C 11/4091 | (2006.01) | |
| G11C 11/4093 | (2006.01) | |

(52) U.S. Cl.
CPC ............ *G11C 7/08* (2013.01); *G11C 7/065* (2013.01); *G11C 7/1006* (2013.01); *G11C 7/1012* (2013.01); *G11C 11/4091* (2013.01); *G11C 11/4093* (2013.01)

(58) Field of Classification Search
CPC ..................... G11C 7/08; G11C 11/4091
See application file for complete search history.

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

International Search Report and Written Opinion from related international application No. PCT/US2015/034101, dated Sep. 8, 2015, 12 pp.

(Continued)

*Primary Examiner* — J. H. Hur
(74) *Attorney, Agent, or Firm* — Brooks, Cameron & Huebsch, PLLC

(57) ABSTRACT

Apparatuses and methods related to performing logical operations using sensing circuitry are disclosed. One example apparatus comprises an array of memory cells and sensing circuitry coupled to the array. The sensing circuitry includes a compute component. The sensing circuitry is configured to invert a data value in the compute component.

21 Claims, 14 Drawing Sheets

(56) References Cited

U.S. PATENT DOCUMENTS

| | | | |
|---|---|---|---|
| 4,977,542 A | 12/1990 | Matsuda et al. | |
| 5,023,838 A | 6/1991 | Herbert | |
| 5,023,841 A * | 6/1991 | Akrout | G11C 7/065 |
| | | | 327/51 |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffmann et al. | |
| 5,289,475 A * | 2/1994 | Slemmer | G11C 29/50 |
| | | | 365/201 |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,426,610 A | 6/1995 | Childers et al. | |
| 5,440,482 A | 8/1995 | Davis | |
| 5,446,690 A * | 8/1995 | Tanaka | G11C 16/10 |
| | | | 365/185.06 |
| 5,473,576 A | 12/1995 | Matsui | |
| 5,481,500 A | 1/1996 | Reohr et al. | |
| 5,485,373 A | 1/1996 | Davis et al. | |
| 5,485,430 A * | 1/1996 | McClure | G11C 7/065 |
| | | | 327/51 |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Node et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,692,466 B2 | 4/2010 | Ahmadi | |
| 7,685,365 B2 | 5/2010 | Rajwar et al. | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mokhlesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shimano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |
| 8,339,883 B2 | 12/2012 | Yu et al. | |
| 8,347,154 B2 | 1/2013 | Bahali et al. | |
| 8,351,292 B2 | 1/2013 | Matano | |
| 8,356,144 B2 | 1/2013 | Hessel et al. | |
| 8,417,921 B2 | 4/2013 | Gonion et al. | |
| 8,462,532 B1 | 6/2013 | Argyres | |
| 8,484,276 B2 | 7/2013 | Carlson et al. | |
| 8,495,438 B2 | 7/2013 | Roine | |
| 8,503,250 B2 | 8/2013 | Demone | |
| 8,526,239 B2 | 9/2013 | Kim | |
| 8,533,245 B1 | 9/2013 | Cheung | |
| 8,555,037 B2 | 10/2013 | Gonion | |
| 8,599,613 B2 | 12/2013 | Abiko et al. | |
| 8,605,015 B2 | 12/2013 | Guttag et al. | |
| 8,625,376 B2 | 1/2014 | Jung et al. | |
| 8,644,101 B2 | 2/2014 | Jun et al. | |
| 8,650,232 B2 | 2/2014 | Stortz et al. | |

(56) References Cited

U.S. PATENT DOCUMENTS

| | | | |
|---|---|---|---|
| 8,873,272 B2 | 10/2014 | Lee | |
| 8,964,496 B2* | 2/2015 | Manning | G11C 7/1006 365/189.07 |
| 8,971,124 B1* | 3/2015 | Manning | G11C 7/06 365/185.01 |
| 9,015,390 B2 | 4/2015 | Klein | |
| 9,047,193 B2 | 6/2015 | Lin et al. | |
| 9,165,023 B2 | 10/2015 | Moskovich et al. | |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0167426 A1 | 9/2003 | Slobodnik | |
| 2003/0222879 A1 | 12/2003 | Lin | |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2005/0265061 A1* | 12/2005 | Kim | G11C 15/00 365/49.15 |
| 2005/0285862 A1* | 12/2005 | Noda | G11C 7/1006 345/502 |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lad et al. | |
| 2006/0291282 A1 | 12/2006 | Liu et al. | |
| 2007/0038919 A1* | 2/2007 | Sekiguchi | G06F 11/1044 714/763 |
| 2007/0103986 A1 | 5/2007 | Chen | |
| 2007/0171747 A1* | 7/2007 | Hunter | G11C 7/065 365/207 |
| 2007/0180006 A1 | 8/2007 | Gyoten et al. | |
| 2007/0180184 A1* | 8/2007 | Sakashita | G11C 16/10 711/100 |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0178053 A1 | 7/2008 | Gorman et al. | |
| 2008/0215937 A1 | 9/2008 | Dreibelbis et al. | |
| 2008/0165601 A1 | 12/2008 | Matick et al. | |
| 2009/0067218 A1 | 3/2009 | Graber | |
| 2009/0154238 A1 | 6/2009 | Lee | |
| 2009/0154273 A1 | 6/2009 | Borot et al. | |
| 2009/0254697 A1 | 10/2009 | Akerib | |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0103159 A1* | 5/2011 | Noorlag | G11C 7/1006 365/189.011 |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0120705 A1 | 5/2012 | Mitsubori et al. | |
| 2012/0134216 A1 | 5/2012 | Singh | |
| 2012/0134226 A1 | 5/2012 | Chow | |
| 2012/0135225 A1 | 5/2012 | Chow | |
| 2012/0140540 A1 | 6/2012 | Agam et al. | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1 | 9/2012 | Akerib et al. | |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0332707 A1 | 12/2013 | Gueron et al. | |
| 2014/0185395 A1 | 7/2014 | Seo | |
| 2014/0215185 A1 | 7/2014 | Danielsen | |
| 2014/0250279 A1 | 9/2014 | Manning | |
| 2014/0344934 A1 | 11/2014 | Jorgensen | |
| 2015/0134713 A1 | 5/2015 | Wheeler | |
| 2015/0324290 A1 | 11/2015 | Leidel | |
| 2015/0325272 A1 | 11/2015 | Murphy | |

FOREIGN PATENT DOCUMENTS

| | | |
|---|---|---|
| EP | 2026209 | 2/2009 |
| JP | H04274097 | 9/1992 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 A1 | 5/2013 |
| WO | 2013081588 | 6/2013 |
| WO | 2013095592 | 6/2013 |

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-in-Memory Chip," Jun. 22-26, 2002, (12 pgs.), ICS '02, retrieved from: http://www.isi.edu/~draper/papers/ics02.pdf.

Adibi, et al., "Processing-in-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

(56) References Cited

OTHER PUBLICATIONS

U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory As a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Office Action for related Taiwan Patent Application No. 104118417, dated Aug. 22, 2016, 23 pages.
Supplementary European Search Report and Written Opinion for related EP Application No. 15802631.0, 8 pages.
Notice of Rejection for related Korea Patent Application No. 10-2017-7000147, dated Jan. 21, 2018, 13 pages.
Office Action for related China Patent Application No. 201580036417.6, dated Apr. 25, 2018, 11 pages.

\* cited by examiner

| | A | B | NOT OPEN | OPEN TRUE | OPEN INVERT |
|---|---|---|---|---|---|
| | 0 | 0 | 0 | 0 | 1 |
| | 0 | 1 | 0 | 1 | 0 |
| | 1 | 0 | 1 | 0 | 1 |
| | 1 | 1 | 1 | 1 | 0 |

| | FF | 0 | 0 | 0 | 0 | 0 | 0 | 1 | 1 | 1 |
|---|---|---|---|---|---|---|---|---|---|---|
| | FT | 0 | 0 | 0 | 1 | 1 | 1 | 0 | 0 | 0 |
| | TF | 0 | 0 | 1 | 0 | 0 | 1 | 0 | 0 | 1 |
| | TT | 0 | 1 | 0 | 0 | 1 | 0 | 0 | 1 | 0 |
| | A | B | A | A*B | A*$\bar{B}$ | A+B | B | AXB | A+$\bar{B}$ | $\overline{AXB}$ | $\bar{B}$ |
| | 0 | 0 | 0 | 0 | 0 | 0 | 0 | 0 | 1 | 1 | 1 |
| | 0 | 1 | 0 | 0 | 0 | 1 | 1 | 1 | 0 | 0 | 0 |
| | 1 | 0 | 1 | 0 | 1 | 1 | 0 | 1 | 1 | 0 | 1 |
| | 1 | 1 | 1 | 1 | 0 | 1 | 1 | 0 | 1 | 1 | 0 |

APPARATUSES AND METHODS FOR PERFORMING INVERT OPERATIONS USING SENSING CIRCUITRY

TECHNICAL FIELD

The present disclosure relates generally to semiconductor memory and methods, and more particularly, to apparatuses and methods related to performing logical operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, XOR, and invert (e.g., inversion) logical operations on data (e.g., one or more operands). For example, functional unit circuitry (FUC) may be used to perform arithmetic operations such as addition, subtraction, multiplication, and/or division on operands.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing.

DETAILED DESCRIPTION

Figure 1:
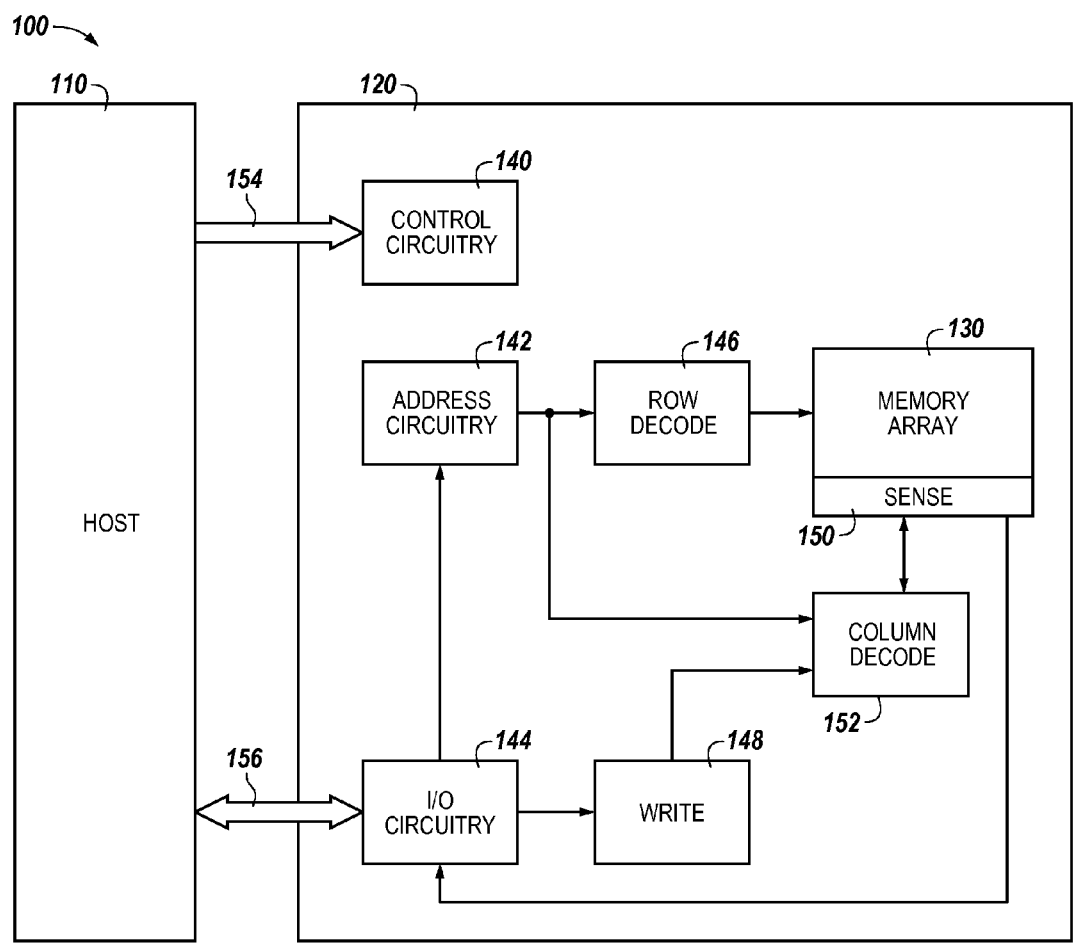
FIG. 1 is a block diagram of an apparatus in the form of a computing system including a memory device in accordance with a number of embodiments of the present disclosure.

The present disclosure includes apparatuses and methods related to performing logical operations using sensing circuitry. An example apparatus comprises an array of memory cells and sensing circuitry coupled to the array. The sensing circuitry includes a compute component. The sensing circuitry is configured to invert a data value in the compute component.

A fundamental and commonly used compute function is invert (e.g., inversion of a data value). Consequently, speed and/or power efficiencies that can be realized with an improved invert operation can translate into speed and/or power efficiencies of higher order functionalities. Described herein are apparatuses and methods for performing an invert operation that does not require activating (e.g., firing) an access line (e.g., a row line) in a memory array. Depending on memory array architecture, the disclosed apparatuses and methods for performing an invert operation may also not require amplification of a data line (e.g., data sense line, sense line, digit line, bit line) pair.

According to various embodiments of the present disclosure, the target data value to be inverted is the data value in a compute component, such as a data value stored in an accumulator of the compute component. The accumulator can be coupled to a sense amplifier (sometimes referred to hereinafter as a "sense amp"). The sense amplifier and accumulator can be latches (e.g., a primary latch and a secondary latch respectively). The invert function can be accomplished by storing a data value in the accumulator and inverting that data value. At the conclusion of the inverting operation, the inverted data value can be, for example, stored in the sense amplifier while the compute component (e.g., the accumulator) still stores the original (e.g., unchanged) data value. The inverted data value can be communicated, used in further computations, or stored in the memory.

Inverting a data value in a compute component is a Boolean logic function used in many higher level functions. The invert operation accomplished in the compute component described herein is considered to be an in-place inversion, as the data value need not be written to a memory cell of a memory array. As such, a row line in the memory array does not need to be activated (e.g., need not be fired). Since a row line in the memory array is not fired during the invert operation, the entire invert operation cycle may execute significantly faster than an invert operation using a memory array access in which a row line does fire.

A number of embodiments of the present disclosure can provide improved speed of operation via parallelism and/or reduced power consumption in association with performing compute functions as compared to previous systems, including previous PIM systems and systems having an external processor (e.g., a processing resource located external from a memory array, such as on a separate integrated circuit chip). For instance, a number of embodiments can provide for performing fully complete compute functions that use the invert operation described herein without transferring data out of the memory array and sensing circuitry via a bus (e.g., data bus, address bus, control bus). Such compute functions that use an invert operation can involve performing a number of logical operations. However, embodiments are not limited to particular examples. For instance, performing logical operations that use the invert operation described herein can also include performing a number of non-Boolean logic operations such as copy, compare, destroy, etc.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. An advantage of the apparatuses and methods described herein can be realized in the cumulative speed that can be achieved by an entire bank of data being computed in parallel without ever transferring data out of the memory array (e.g., DRAM) or firing a column decode. In other words, data transfer time can be significantly reduced or eliminated. In this manner, significantly higher throughput is effectively provided than for conventional configurations involving a central processing unit (CPU) discrete from the memory such that data must be transferred therebetween. A PIM can also use less energy/area than configurations where the CPU is discrete from the memory, and a PIM including the apparatuses and/or implementing the methods of the present disclosure further improve upon the smaller energy/area advantages since the in-place invert operation saves energy by eliminating certain data value transfers.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute engine, which can involve performing a data line address access (e.g., firing of a column decode signal) in order to transfer data from data lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 306 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines, row lines, or select lines) and columns coupled by sense lines (which may be referred to herein as data lines or digit lines). Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be loaded into the sensing circuitry 150. For example, data can be read from memory array 130 (e.g., by sensing voltage and/or current changes on the data lines using sensing circuitry 150). The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

An example of the sensing circuitry 150 is described further below in association with FIGS. 2 and 3. For instance, in a number of embodiments, the sensing circuitry 150 can comprise a number of sense amplifiers (e.g., sense amplifier 206 shown in FIG. 2 or sense amplifier 306 shown in FIG. 3) and a number of compute components (e.g., compute component 231 shown in FIG. 2), which may comprise an accumulator and can be used to perform logical operations (e.g., on data associated with complementary data lines).

In a number of embodiments, the sensing circuitry (e.g., 150) can be used to perform logical operations using data stored in array 130 as inputs and store the results of the logical operations back to the array 130 without transferring via a data line address access (e.g., without firing a column decode signal). As such, various compute functions can be performed within using sensing circuitry 150 rather than (or in association with) being performed by processing resources external to the sensing circuitry (e.g., by a processor associated with host 110 and/or other processing circuitry, such as ALU circuitry, located on device 120 (e.g., on control circuitry 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry (e.g., 150) is configured to perform logical operations on data stored in memory (e.g., array 130) and store the result back to the memory without activating an I/O line (e.g., a local I/O line) coupled to the sensing circuitry, which can be formed on pitch with the memory cells of the array. Activating an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without activating column decode lines of the array; however, the local I/O line(s) may be activated in order to transfer a result to a suitable location other than back to the array (e.g., to an external register).

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
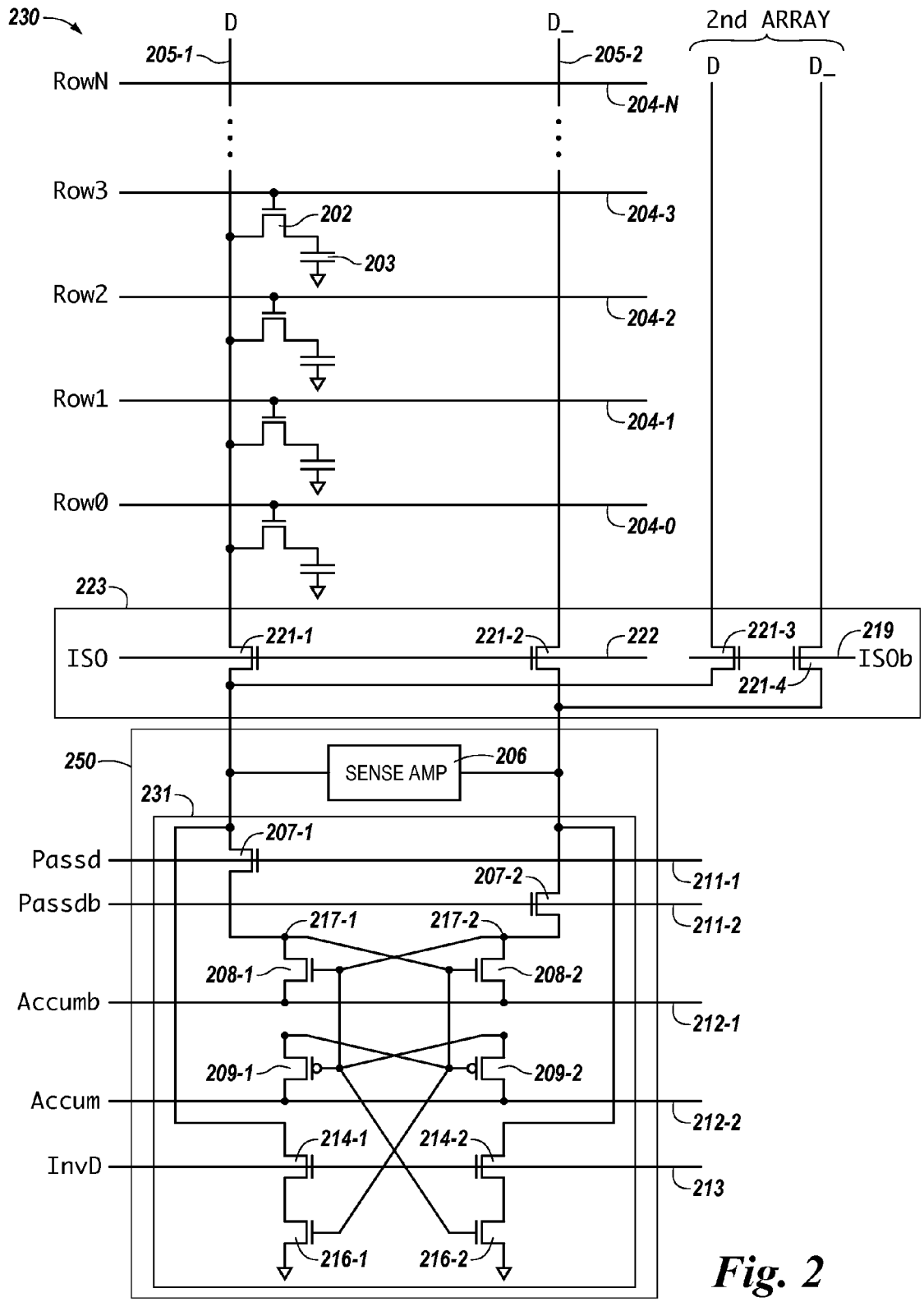
FIG. 2 illustrates a schematic diagram of a portion of a memory array coupled to sensing circuitry in accordance with a number of embodiments of the present disclosure.

FIG. 2 illustrates a schematic diagram of a portion of a memory array 230 coupled to sensing circuitry 250 in accordance with a number of embodiments of the present disclosure. In this example, the memory array 230 can be a DRAM array of 1T1C (i.e., one transistor one capacitor) memory cells each comprised of an access device 202 (e.g., transistor) and a storage element 203 (e.g., a capacitor). In a number of embodiments, the memory cells may be destructive read memory cells (e.g., reading the data stored in the cell destroys the data such that the data originally stored in the cell is refreshed after being read). The cells of array 230 can be arranged in rows coupled by word lines 204-0 (Row0), 204-1 (Row1), 204-2, (Row2) 204-3 (Row3), . . . , 204-N(RowN) and columns coupled by data lines (e.g., digit lines) 205-1 (D) and 205-2 (D_).

In this example, each column of cells is associated with a pair of complementary data lines 205-1 (D) and 205-2 (D_) (i.e., "D bar"). Although only a single column of memory cells is illustrated in FIG. 2, embodiments are not so limited. For instance, a particular array may have a number of columns of memory cells and/or data lines (e.g., 4,096, 8,192, 16,384, etc.). A gate of a particular memory cell transistor 202 can be coupled to its corresponding word line 204-0, 204-1, 204-2, 204-3, . . . , 204-N, a first source/drain region is coupled to its corresponding data line 205-1, and a second source/drain region of a particular memory cell transistor can be coupled to its corresponding capacitor 203. Although not illustrated in FIG. 2, the data line 205-2 may also be coupled to a column of memory cells.

The array 230 is coupled to sensing circuitry 250 in accordance with a number of embodiments of the present disclosure. In this example, the sensing circuitry comprises a sense amplifier 206 and a compute component 231. The sensing circuitry can be sensing circuitry 150 shown in FIG. 1, for example. The sense amplifier 206 can be coupled to the complementary data lines D and D_corresponding to a particular column of memory cells. The sense amplifier 206 can be a sense amplifier such as sense amplifier 306 described below in association with FIG. 3. As such, the sense amplifier 206 can be operated to determine a state (e.g., logic data value) stored in a selected cell.

The cross coupled latch corresponding to sense amplifier 206 can be referred to herein as a primary latch. Embodiments are not limited to the example sense amplifier 206. For instance, sensing circuitry in accordance with a number of embodiments described herein can include current-mode sense amplifiers and/or single-ended sense amplifiers (e.g., sense amplifiers coupled to one data line). The compute component 231 includes a latch such as a static cross-coupled latch. The latch of the compute component 231 can be referred to herein as a secondary latch, which can serve as, and be referred to herein as, an accumulator. The compute component 231 can be operated in conjunction with sense amplifier 206 to implement logical operations.

The sense amplifier 206 and the compute component 231 can be coupled to the array 230 via an isolation device 223. The isolation device 223 can include a pair of isolation transistors 221-1 and 221-2 coupled to data lines D and D_, respectively. The isolation transistors 221-1 and 221-2 can be coupled to a control signal 222 (ISO) that, when activated, enables (e.g., turns on) the isolation transistors 221-1 and 221-2 to connect the sense amplifier 206 and the compute component 231 to a column of memory cells.

As illustrated in FIG. 2, the isolation device 223 can include another pair of isolation transistors 221-3 and 221-4 coupled to a complementary control signal 219 (e.g., ISOb) (i.e., "ISO bar"), which is activated when ISO is deactivated. The isolation transistors 221-3 and 221-4 can be arranged such that the sense amplifier 206 and the compute component 231 are coupled to a second memory array and isolated from a first memory array, or coupled to the first memory array and isolated from the second memory array. According to various embodiments, the isolation device 223 can be arranged as a portion of (e.g., within) the sense amplifier 206, as shown with respect to FIG. 3.

In a number of embodiments, a compute component (e.g., 231) can comprise a number of transistors formed on pitch with the transistors of the sense amplifier (e.g., 206) and/or the memory cells of the array (e.g., 230), which may conform to a particular feature size (e.g., $4F^2$, $6F^2$, etc.). As described further below, the compute component 231 can, in conjunction with the sense amplifier 206, operate to perform various logical operations using data from array 230 as input. The result can be stored back to the array 230 without transferring the data via a data line address access (e.g., without firing a column decode signal such that data is transferred to circuitry external from the array and sensing circuitry via local I/O lines). As such, a number of embodiments of the present disclosure can enable performing logical operations and computing functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

In the example illustrated in FIG. 2, the circuitry corresponding to compute component 231 comprises six transistors coupled to each of the data lines D and D_ (e.g., through isolation device 223). However, embodiments are not limited to this example. Transistors 207-1 and 207-2 have a first source/drain region coupled to data lines D and D_ respectively, and a second source/drain region coupled to a cross coupled latch (e.g., coupled to gates of a pair of cross coupled transistors, such as cross coupled NMOS transistors 208-1 and 208-2 and cross coupled PMOS transistors 209-1 and 209-2). As described further herein, the cross coupled latch comprising transistors 208-1, 208-2, 209-1, and 209-2 can be referred to as a secondary latch, as previously mentioned.

The transistors 207-1 and 207-2 can be referred to as pass transistors, which can be enabled via respective signals 211-1 (Passd) and 211-2 (Passdb) (i.e., "Passd bar") in order to pass the voltages or currents on the respective data lines D and D_ to the inputs of the cross coupled latch comprising transistors 208-1, 208-2, 209-1, and 209-2 (e.g., the input of the secondary latch). In this example, the second source/drain region of transistor 207-1 is coupled to a first source/drain region of transistors 208-1 and 209-1 as well as to the gates of transistors 208-2 and 209-2. Similarly, the second source/drain region of transistor 207-2 is coupled to a first source/drain region of transistors 208-2 and 209-2 as well as to the gates of transistors 208-1 and 209-1.

A second source/drain region of transistor 208-1 and 208-2 is commonly coupled to a first (e.g., active low) control signal 212-1 (Accumb) (i.e., "Accum bar"). A second source/drain region of transistors 209-1 and 209-2 is commonly coupled to a second (e.g., active high) control signal 212-2 (Accum). The active Accum signal 212-2 can be a supply voltage (e.g., VDD) and the active Accumb signal can be a reference voltage (e.g., ground). Activating signals 212-1 and 212-2 enables the cross coupled latch comprising transistors 208-1, 208-2, 209-1, and 209-2 (corresponding to the secondary latch).

The enabled cross coupled latch operates to amplify a differential voltage between common node 217-1 and common node 217-2 such that node 217-1 is driven to one of the Accum signal voltage and the Accumb signal voltage (e.g., to one of VDD and ground), and node 217-2 is driven to the other of the Accum signal voltage and the Accumb signal voltage. As described further below, the signals 212-1 and 212-2 are labeled "Accum" and "Accumb" because the secondary latch can serve as an accumulator while being used to perform a logical operation. In a number of embodiments, an accumulator comprises the cross coupled transistors 208-1, 208-2, 209-1, and 209-2 forming the secondary latch as well as the pass transistors 207-1 and 207-2. As described further herein, in a number of embodiments, a compute component comprising an accumulator coupled to a sense amplifier can be configured to perform a logical operation that comprises performing an accumulate operation on a data value represented by a signal (e.g., voltage or current) on at least one of a pair of complementary data lines.

The compute component 231 also includes inverting transistors 214-1 and 214-2 having a first source/drain region coupled to the respective digit lines D and D_ (e.g., through isolation device 223). A second source/drain region of the transistors 214-1 and 214-2 is coupled to a first source/drain region of transistors 216-1 and 216-2, respectively. The gates of transistors 214-1 and 214-2 are coupled to a signal 213 (InvD). The gate of transistor 216-1 is coupled to the common node 217-1 to which the gate of transistor 208-2, the gate of transistor 209-2, and the first source/drain region of transistor 208-1 are also coupled. In a complementary fashion, the gate of transistor 216-2 is coupled to the common node 217-2 to which the gate of transistor 208-1, the gate of transistor 209-1, and the first source/drain region of transistor 208-2 are also coupled. As such, activating signal InvD serves to invert the data value stored in the secondary latch and drives the inverted value onto data lines 205-1 and 205-2 (assuming the isolation transistors 221 are enabled).

The compute component 231 shown in FIG. 2 can be operated (e.g., via the Passd, Passdb, Accumb, Accum, and InvD signals) to perform various logical operations including AND, NAND, OR, NOR, and invert operations, among others. The logical operations can be R-input logical operations, with "R" representing a value of two or more.

For instance, an R-input logical operation can be performed using data stored in array 230 as inputs, and the result can be stored to a suitable location (e.g., back to array 230 and/or to a different location) via operation of the sensing circuitry and/or for further operations in the accumulator. In the examples described below, an R-input logical operation includes using a data value (e.g., logic 1 or logic 0) stored in a memory cell coupled to a first particular word line (e.g., 204-0) and to a particular data line (e.g., 205-1) as a first input and data values stored in memory cells coupled to a number of additional word lines (e.g., 204-1 to 204-N), and commonly coupled to the particular data line (e.g., 205-1), as a respective number of additional inputs. In this manner, a number of logical operations can be performed in parallel. For instance, 4K logical operations could be performed in parallel on an array having 4K data lines. In this example, 4K cells coupled to a first word line could serve as 4K first inputs, 4K cells coupled to a second word line could serve as 4K second inputs, and 4K cells coupled to a third word line could serve as 4K third inputs in a 3-input logical operation. As such, in this example, 4K separate 3-input logical operations can be performed in parallel.

In a number of embodiments, a first operation phase of an R-input logical operation includes performing a sensing operation on a memory cell coupled to a particular word line (e.g., 204-0) and to a particular data line (e.g., 205-1) to determine its stored data value (e.g., logic 1 or logic 0), which serves as a first input in an R-input logical operation. The first input (e.g., the sensed stored data value) can then be stored in (e.g., transferred or copied to) a latch associated with compute component 231. A number of intermediate operation phases can be performed and can also include performing sensing operations on memory cells coupled to a respective number of additional word lines (e.g., 204-1 to 204-N) and to the particular data line (e.g., 205-1) to determine their stored data values, which serve as a respective number of additional inputs (e.g., R-1 additional inputs) to the R-input logical operation.

A last operation phase of an R-input logical operation involves operating the sensing circuitry to store the result of the logical operation to a suitable location. As an example, the result can be stored back to the array (e.g., back to a memory cell coupled to the particular data line 205-1). Storing the result back to the array can occur without activating a column decode line. The result can also be stored to a location other than in array 230. For instance, the result can be stored (e.g., via local I/O lines coupled to sense amplifier 206) to an external register associated with a processing resource such as a host processor; however, embodiments are not so limited. Details regarding the first, intermediate, and last operation phases are described further below in association with FIG. 4.

Figure 3:
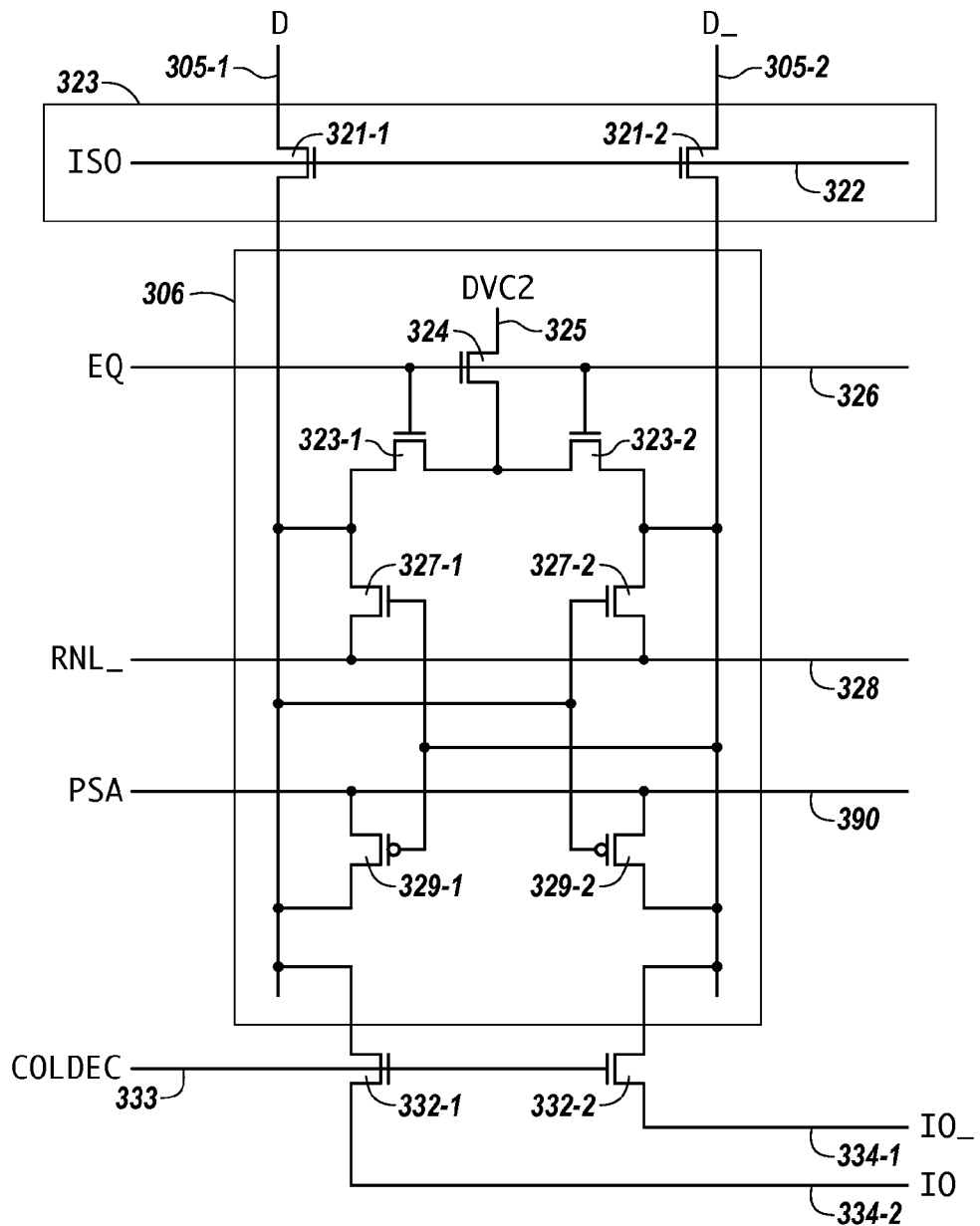
FIG. 3 illustrates a schematic diagram of a portion of sensing circuitry in accordance with a number of embodiments of the present disclosure.

FIG. 3 illustrates a schematic diagram of a portion of sensing circuitry in accordance with a number of embodiments of the present disclosure. In this example, the portion of sensing circuitry comprises a sense amplifier 306. In a number of embodiments, one sense amplifier 306 (e.g., "sense amp") is provided for each column of memory cells in an array (e.g., array 130). The sense amplifier 306 can be sense amplifier of a DRAM array, for instance. In this example, sense amplifier 306 is coupled to a pair of complementary data lines 305-1 ("D") and 305-2 ("D_") (e.g., "D bar") through an isolation device 323. As such, the sense amplifier 306 can be coupled to all of the memory cells in a respective column through data lines D and D_.

Isolation device 323 can be implemented similar to that shown in FIG. 2 at 223. Isolation device 323 can include a pair of isolation transistors 321-1 and 321-2 coupled to data lines D and D_, respectively. Although not shown in FIG. 3, isolation device 323 can include another pair of isolation transistors coupled to a complementary control signal (e.g., ISO_), which is activated independently or in coordination with deactivation of the ISO control signal such that the sense amplifier 306 can be selectively coupled to a number of memory array data lines respectively. According to various embodiments, the sense amplifier 306 can include the isolation device 323.

The sense amplifier 306 can include a pair of cross coupled n-channel transistors (e.g., NMOS transistors) 327-1 and 327-2 having their respective sources coupled to a first (active negative) control signal 328 (RNL_) and their drains coupled to data lines D and D_, respectively. The sense amplifier 306 can also include a pair of cross coupled p-channel transistors (e.g., PMOS transistors) 329-1 and 329-2 having their respective sources coupled to a second (active positive) control signal 390 (PSA) and their drains coupled to data lines D and D_, respectively.

The sense amplifier 306 can also include circuitry configured to equilibrate the data lines D and D_. In this example, the equilibration circuitry comprises a transistor 324 having a first source/drain region coupled to an equilibration voltage 325 (dvc2), which can be equal to VDD/2, where VDD is a supply voltage associated with the array. A second source/drain region of transistor 324 can be coupled to a common first source/drain region of a pair of transistors 325-1 and 325-2. The second source drain regions of transistors 325-1 and 325-2 can be coupled to data lines D and D_, respectively. The gates of transistors 324, 325-1, and 325-2 can be coupled to control signal 326 (EQ). As such, activating EQ enables the transistors 324, 325-1, and 325-2, which effectively shorts data line D to data line D_ such that the data lines D and D_ are equilibrated to equilibration voltage dvc2.

The sense amplifier 306 can also include transistors 332-1 and 332-2 whose gates are coupled to a signal 333 (COLDEC). Signal 333 may be referred to as a column decode signal (e.g., a column select signal). The data lines D and D_ can be connected to respective local I/O lines 334-1 (IO) and 334-2 (IO_) responsive to activating signal 333 (e.g., to perform an operation such as a data line access in association with a read operation). As such, signal 333 can be activated to transfer a signal corresponding to the state (e.g., a logic data value such as logic 0 or logic 1) of the memory cell being accessed out of the array on the I/O lines 334-1 and 334-2.

In operation, when a memory cell is being sensed (e.g., read), the voltage on one of the data lines D, D_ will be slightly greater than the voltage on the other one of data lines D, D_. The PSA signal is then driven high and the RNL_ signal is driven low to enable the sense amplifier 306. The data line D, D_ having the lower voltage will turn on one of the PMOS transistor 329-1, 329-2 to a greater extent than the other of PMOS transistor 329-1, 329-2, thereby driving high the data line D, D_ having the higher voltage to a greater extent than the other data line D, D_ is driven high.

Similarly, the data line D, D_ having the higher voltage will turn on one of the NMOS transistor 327-1, 327-2 to a greater extent than the other of the NMOS transistor 327-1, 327-2, thereby driving low the data line D, D_ having the lower voltage to a greater extent than the other data line D, D_ is driven low. As a result, after a short delay, the data line D, D_ having the slightly greater voltage is driven to the voltage of the PSA signal (which can be the supply voltage VDD), and the other data line D, D_ is driven to the voltage of the RNL_ signal (which can be a reference potential such as a ground potential). Therefore, the cross coupled NMOS transistors 327-1, 327-2 and PMOS transistors 329-1, 329-2 serve as a sense amplifier pair, which amplify the differential voltage on the data lines D and D_ and serve to latch a data value sensed from the selected memory cell. As used herein, the cross coupled latch of sense amplifier 306 may be referred to as a primary latch. In contrast, and as described above in connection with FIG. 2, a cross coupled latch associated with a compute component (e.g., compute component 231 shown in FIG. 2) may be referred to as a secondary latch.

Referring back to FIG. 2, and with the sense amplifier 206 shown in FIG. 2 comprising the circuitry shown at 306 in FIG. 3, according to various embodiments of the present disclosure an apparatus (e.g., a memory array) can comprises an array of memory cells and sensing circuitry coupled to the array. The sensing circuitry can include a compute component (that includes a latch), and be configured to invert a data value stored in the latch. The latch can comprise a first pair of transistors and a second pair of transistors formed on pitch with memory cells of the array, for instance.

The sensing circuitry can be configured to invert the data value stored in the latch to an inverted data value while the original data value is still retained in the latch. The sensing circuitry can also be configured and/or operated to store the inverted data value in the sense amplifier. The sensing circuitry can additionally comprise an isolation device, which can be configured and/or operated such that the inverted data value can be stored in the sense amplifier while the array is isolated from the sensing circuitry.

As shown in FIG. 2, the sensing circuitry can be coupled to the array of memory cells by a data line (e.g., through an isolation device). As such, the sensing circuitry can be configured and/or operated to sense the data value from a memory cell coupled to the data line, accumulate the data value from the latch to the secondary latch without performing a data line address access, and invert the data value after the data value is accumulated in the secondary latch. The isolation device can be configured to couple the sensing circuitry to a second array such that at most one of the array and a second array are connected to the sensing circuitry at once. The isolation device can also be configured such that the array and the second array can both be simultaneously disconnected from the sensing circuitry.

Figure 4:
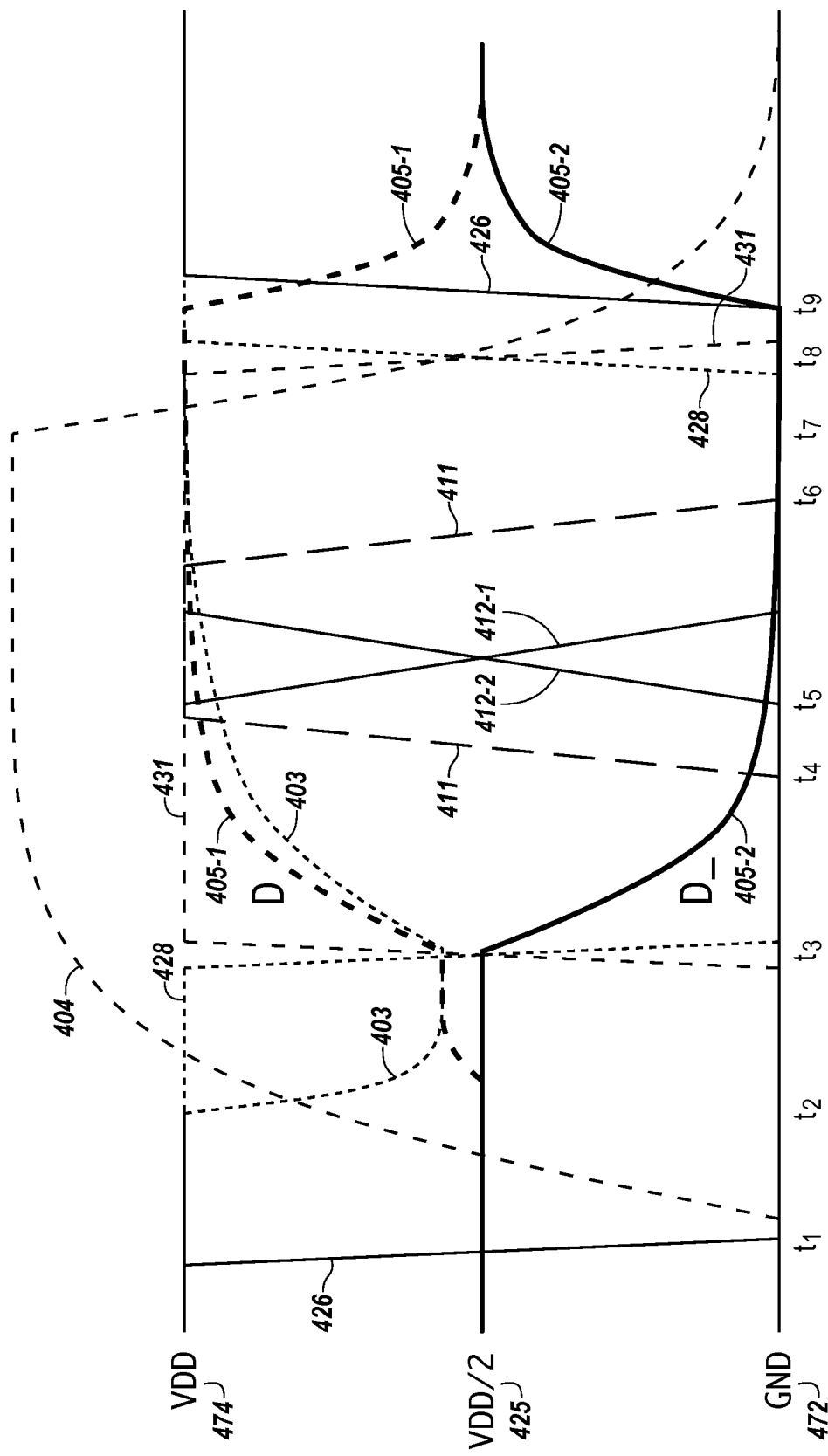
FIG. 4 illustrates a timing diagram associated with performing a number of logical operations using sensing circuitry in accordance with a number of embodiments of the present disclosure.

FIG. 4 illustrates a timing diagram associated with performing a number of logical operations using sensing circuitry in accordance with a number of embodiments of the present disclosure. The timing diagram shown in FIG. 4 illustrates signals (e.g., voltage signals) associated with performing a logical operation (e.g., an invert operation), which can be accomplished by the circuits described above with respect to FIG. 2, for example. The sensing circuitry can be configured to perform the logical operation, which can include loading, to a sense amplifier coupled to a data line (and/or pair of complementary data lines), a data value, storing the data value in a compute component coupled to the sense amplifier, and inverting the data value in the compute component. The data line (and/or pair of complementary data lines) can be equilibrated prior to (and/or after) loading the data value to the sense amplifier.

The inverted data value can subsequently be loaded back onto the data line (and/or pair of complementary data lines). Inverting the data value in the compute component can be accomplished without performing an address access of the data line(s) and/or without activating input/output (I/O) line(s) that may be coupled to the sense amplifier and/or without activating a row of memory cells in an array switchably coupled to the data line and/or without amplification of the complimentary pair of data lines.

Inverting the data value in the compute component can include simultaneously retaining the original data value (e.g., latched) in the accumulator. For example, the data value can be stored in the accumulator before inverting the data value in the compute component while simultaneously retaining the data value in the accumulator. Thereafter, the inverted data value can be stored in the accumulator. If desired, the inverted data value stored in the accumulator can be inverted again (e.g., re-inverting) in the compute component (e.g., back to the data value) while simultaneously retaining the inverted data value in the accumulator.

Where the sensing circuitry is coupled to a second array of memory cells (e.g., of multiple arrays such as through a selectable isolation device), the sensing circuitry can be configured to load a second data value from the second array to the sense amplifier, store the second data value in the compute component coupled to the sense amplifier, and invert the second data value in the compute component. A number of isolation transistors of the isolation device can be operated to connect the sense amplifier to complimentary data lines of a single one of multiple arrays and isolate the sense amplifier from complimentary data lines of all other of the multiple arrays prior to inverting the data value to an inverted data value on the complementary data lines. The number of isolation transistors of the isolation device can also be operated to isolate the sense amplifier from complimentary data lines of all of the multiple arrays, such as after loading a data value, or prior to or after inverting the data value to an inverted data value.

The timing diagram shown in FIG. 4 illustrates signals (e.g., voltage signals) associated with performing a first operation phase of an invert logical operation (e.g., an R-input logical operation). The first operation phase described with respect to FIG. 4 can be a first operation phase of an AND, NAND, OR, NOR, or invert operation, for instance. However, the first operation phase described with respect to FIG. 4 is limited herein to that applicable in preparation for performing the operation phase comprising an invert operation. As described further below, performing the first operation phase illustrated in FIG. 4 can involve consuming less energy (e.g., on the order of fifty percent) than previous processing approaches that may involve providing a full swing between voltage rails (e.g., between a supply and ground) in performing a compute function.

In the example illustrated in FIG. 4, the voltage rails corresponding to complementary logic values (e.g., "1" and "0") are a supply voltage 474 (VDD) and a ground voltage 472 (GND). Prior to performing a logical operation, an equilibrate operation can occur such that the complementary data lines D and D_ are shorted together at an equilibration voltage 425 (VDD/2), as was previously described with respect to sense amplifier 306 illustrated in FIG. 3. Operations to store data in the accumulator can be summarized as follows:

---
Store data values from Row X in the Accumulator
    Deactivate EQ
    Enable Row X
    Enable Sense Amps (after which RowX data resides in the sense amps)
    Activate Passd and Passdb (sense amplifier data (Row X) is transferred to the Accumulator
    Deactivate Passd and Passdb
    Disable Row X
    Precharge
---

The timing diagram shown in FIG. 4 illustrates signals associated with storing data from memory cells in Row X (where 1<=X<=N) of the memory array in the accumulator. At time $t_1$, the equilibration signal 426 is deactivated, and then a row of memory cells is enabled (e.g., selected, opened such as by activating a signal to select a particular row). For example, the enabled row includes a memory cell whose data value is to be sensed and used as a first input. Row signal 404 represents the voltage signal applied to the selected row (e.g., Row3 shown in FIG. 2). When row signal 404 reaches the threshold voltage (Vt) of the access transistor (e.g., 202 shown in FIG. 2) corresponding to the selected memory cell (e.g., 203 shown in FIG. 2), the access transistor turns on and couples the data line D to the selected memory cell, which creates a differential voltage signal between the data lines D and D_ (e.g., as indicated by signals 405-1 and 405-2, respectively) between times $t_2$ and $t_3$. The voltage of the selected cell is represented by signal 403. Due to conservation of energy, creating the differential signal between D and D_ (e.g., by coupling the cell to data line D) does not consume energy, since the energy associated with activating/deactivating the row signal 404 can be amortized over the plurality of memory cells coupled to the row.

At time $t_3$, the sense amplifier (e.g., 206 shown in FIG. 2) is enabled (e.g., the second control signal 431, e.g., the signal PSA 390 shown in FIG. 3, goes active high, and the first control signal 428, e.g., the signal RNL 328 shown in FIG. 3) goes active low), which amplifies the differential signal between D and D_, resulting in a voltage (e.g., VDD) corresponding to a logic 1 or a voltage (e.g., GND) corresponding to a logic 0 being on data line D (and the voltage corresponding to the other logic state being on complementary data line D_), such that the sensed data value is stored in the primary latch of sense amplifier 206 shown in FIG. 2 (or sense amplifier 306 shown in FIG. 3). The primary energy consumption occurs in charging the data line D (205-1 shown in FIG. 2 or 305-1 shown in FIG. 3) from the equilibration voltage VDD/2 to the rail voltage VDD.

At time $t_4$, the pass transistors (e.g., 207-1 and 207-2 shown in FIG. 2) are enabled (e.g., via respective Passd and Passdb control signals 411 applied to control lines 211-1 and 211-2 shown in FIG. 2, respectively). As used herein, various control signals, such as Passd and Passdb, may be referenced by referring to the control lines to which the signals are applied.

At time $t_5$, the accumulator control signals, Accumb 412-1 and Accum 412-2, are activated via respective control lines 212-1 and 212-2 shown in FIG. 2. As described below, the accumulator control signals 412-1 and 412-2 may remain activated for subsequent operation phases. As such, in this example, activating the accumulator control signals 412-1 and 412-2 enables the secondary latch (e.g., accumulator) of compute component 231 shown in FIG. 2. The sensed data value stored in the sense amplifier (e.g., sense amplifier 206 shown in FIG. 2 or sense amplifier 306 shown in FIG. 3) is thus stored in the secondary latch.

At time $t_6$, the pass transistors (e.g., transistors 207-1 and 207-2 shown in FIG. 2) can be disabled (e.g., turned off). However, since the accumulator control signals 412-1 and 412-2 remain activated, an accumulated result is stored (e.g., latched) in the secondary latch (e.g., accumulator).

At time $t_7$, the row signal 404 can be deactivated to disable (e.g., deselect, close such as by deactivating a select signal for a particular row) the row of memory cells. At time $t_8$ the array sense amps can be disabled (e.g., the first control signal 428 goes high and the second control signal 431 goes low).

At time $t_9$, the data lines D and D_ can be equilibrated (e.g., equilibration signal 426 can be activated), as illustrated by data line voltage signals 405-1 and 405-2 moving from their respective rail values to the equilibration voltage 425 (VDD/2). The equilibration consumes little energy due to the law of conservation of energy. As previously described, the equilibrate operation can involve shorting the complementary data lines D and D_ together at an equilibration voltage, which can be VDD/2, in this example. Equilibration can occur, for instance, prior to a memory cell sensing operation or the inverting operation (described below).

Figure 5:
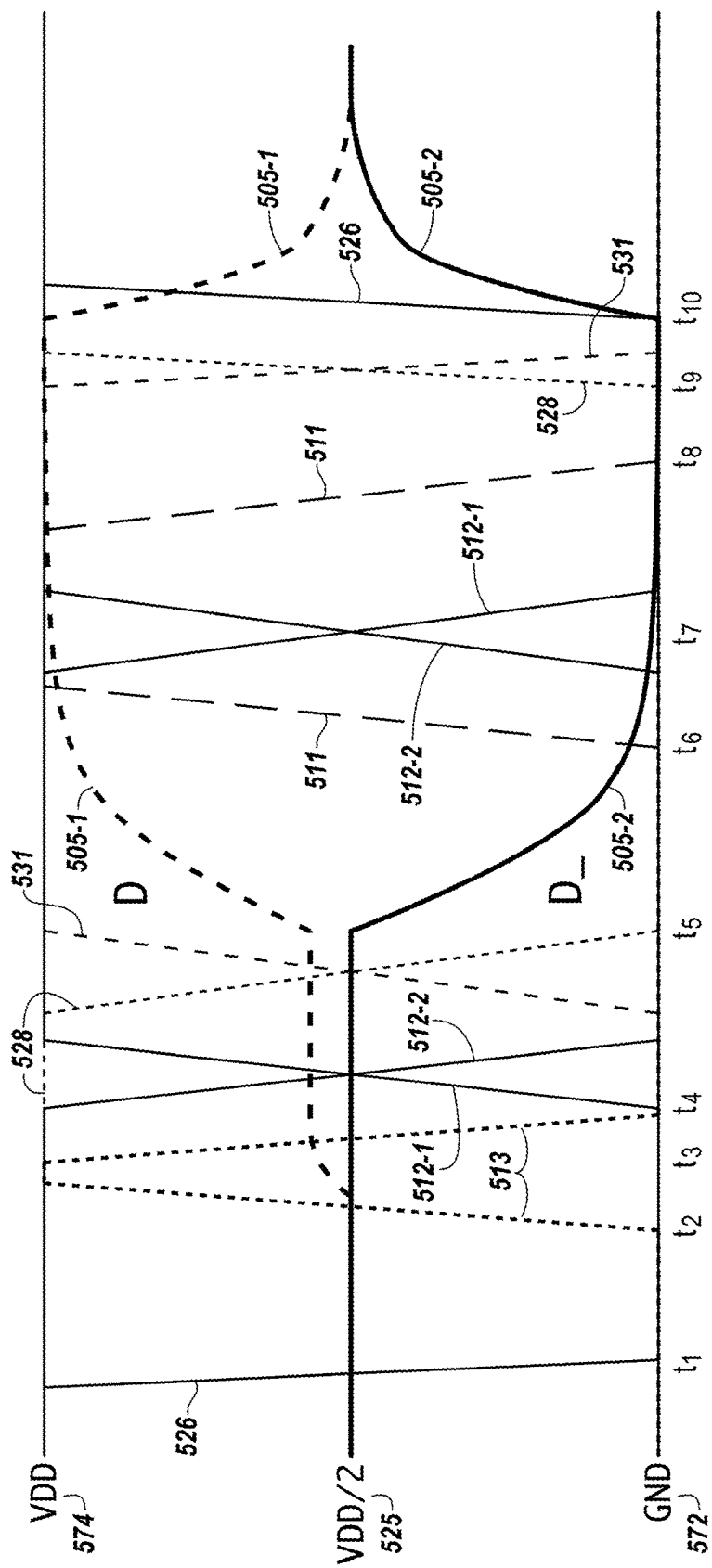
FIG. 5 illustrates a timing diagram associated with performing an invert operation using sensing circuitry in accordance with a number of embodiments of the present disclosure.

FIG. 5 illustrates a timing diagram associated with performing an invert operation using sensing circuitry in accordance with a number of embodiments of the present disclosure. After Row X data is stored in the Accumulator, an operation phase to invert the data values stored in the Accumulator (and store the inverted data in the Accumulator) can be summarized as follows:

---
NOT (Row X) and Store Result in Accumulator
    Deactivate Equilibriate (EQ)
    Activate InvD
    Deactivate InvD
    Disable Accumulator
    Enable Sense amplifier (e.g., Fire NPSA, after which Inverse RowX

```
    data resides in the sense amp)
Activate Passd and Passdb
Enable Accumulator (e.g., after which Inverse RowX data resides
 in
    the Accumulator)
Deactivate Passd and Passdb
Disable Sense amplifier (e.g., Close NPSA)
Activate Equilibrate (EQ) to Precharge
```

The timing diagram shown in FIG. 5 illustrates signals (e.g., voltage signals) associated with performing an intermediate operation phase of a logical operation. For instance, the timing diagram shown in FIG. 5 corresponds to an intermediate operation phase of an INVERT operation. Other logical operations can be performed prior to or following performing the INVERT function. Performing logical operation(s) can include performing the INVERT function operation phase shown and discussed with respect to FIG. 5 one or more times subsequent to an initial operation phase (such as that described in FIG. 4) and/or one or more times before or subsequent to performing other operational phase(s) to accomplish other logical functions.

As shown in the timing diagram shown in FIG. 5, at time $t_1$, equilibration is disabled (e.g., the equilibration signal 526 is deactivated).

At time $t_2$, the inverting transistors (e.g., 214-1 and 214-2 shown in FIG. 2) can be enabled (e.g., turned-on via respective InvD control signal 513 going high as may be applied to control line 213 shown in FIG. 2).

At time $t_3$, the inverting transistors (e.g., 214-1 and 214-2 shown in FIG. 2) can be disabled (e.g., turned-off via respective InvD control signal 513 going low on control line 213 shown in FIG. 2).

At time $t_4$, the accumulator control signals, Accumb 512-1 and Accum 512-2, are deactivated via respective control lines 212-1 and 212-2 shown in FIG. 2. As such, in this example, deactivating the accumulator control signals 512-1 and 512-2 disables the secondary latch (e.g., accumulator) of compute component 231 shown in FIG. 2. Disabling the accumulator retains the sensed data value (e.g., non-inverted) in the accumulator as the sense amplifier is being enabled to stored the inverted data value in the sense amp. Thereafter, the inverted data value stored in the sense amplifier 306 shown in FIG. 3 can be stored in the secondary latch (or into a selected location in a Row) by controlling appropriate Passd and Passdb (and/or Row) transistors to establish the desired communication path from the sense amp.

At time $t_5$, the sense amplifier (e.g., 206 shown in FIG. 2) is enabled (e.g., the second control signal 531 goes high, and the first control signal 528 signal goes low), which amplifies the differential signal between D and D_, resulting in a voltage corresponding to a logic 1 (e.g., VDD) or a voltage corresponding to a logic 0 (e.g., GND) being on data line D. The voltage corresponding to a complimentary logic state is on complementary data line D_. The inverted data value is thus stored in the primary latch of sense amplifier 206 shown in FIG. 2 (or sense amplifier 306 shown in FIG. 3). The primary energy consumption occurs in charging the data line D (205-1 shown in FIG. 2 or 305-1 shown in FIG. 3) from the equilibration voltage VDD/2 to the rail voltage VDD.

At time $t_6$, the pass transistors (e.g., 207-1 and 207-2 shown in FIG. 2) are enabled (e.g., via respective Passd and Passdb control signal 511 going high as may be applied to control lines 211-1 and 211-2 shown in FIG. 2, respectively).

At time $t_7$, the accumulator control signals, Accumb 412-1 and Accum 412-2, are activated via respective control lines 212-1 and 212-2 shown in FIG. 2. As described below, the accumulator control signals 512-1 and 512-2 may remain activated for subsequent operation phases. In this example, activating the accumulator control signals 512-1 and 512-2 enables the secondary latch (e.g., accumulator) of compute component 231 shown in FIG. 2. The inverted data value stored in the sense amplifier (e.g., sense amplifier 206 shown in FIG. 2 or sense amplifier 306 shown in FIG. 3) is stored in the secondary latch.

At time $t_8$, the pass transistors (e.g., transistors 207-1 and 207-2 shown in FIG. 2) can be disabled (e.g., turned off), as shown in FIG. 5 by the Passd and Passdb control signal 511 going low.

At time $t_9$, the sense amplifier (e.g., 206 shown in FIG. 2) is disabled (e.g., by virtue of the second control signal 531 going low and the first control signal 528 going high). The sense amplifier still retains the inverted data value (e.g., inverted with respect to the data value originally sensed by the sense amp).

At time $t_{10}$, the data lines D and D_ can be equilibrated (e.g., equilibration signal 526 can be activated), as illustrated by data line voltage signals 505-1 and 505-2 moving from their respective rail values to the equilibration voltage 525 (VDD/2). The equilibration consumes little energy due to the law of conservation of energy. As previously described, the equilibrate operation can involve shorting the complementary data lines D and D_ together at an equilibration voltage, which can be VDD/2, in this example. Equilibration can occur, for instance, prior to a memory cell sensing operation or the inverting operation (described below).

According to various embodiments of the present disclosure, the inverted data value is latched into the sense amplifier (e.g., 206 shown in FIG. 2) after $t_5$, as described above with respect to FIG. 5, rather than (or in addition to) activating the Passd and Passdb control signal 511 and enabling the accumulator to store the inverted data. A selected row can also be activated to store the inverted data in a selected memory cell.

To store the inverted data value in the memory cell of a selected row, the row signal can be activated at just before or just after time $t_6$ (as shown in FIG. 5) and deactivated just before or just after time $t_8$ (as shown in FIG. 5) in addition to or in lieu of activating the Passd and Passdb control signals 511 shown in FIG. 5. According to one example implementation, the Passd and Passdb control signal 511 can be deactivated prior to deactivating the appropriate row signal (e.g., to disable the selected row).

In an array architecture utilizing a data line isolation device (e.g., isolation device 223 shown in FIG. 2), after Row X data is stored in the Accumulator, operations to invert the data in the compute component of a selected memory array (e.g., a first memory array or second memory array) can be summarized as follows:

```
NOT (RowX) where unused memory array is isolated
    Configure isolation transistors (e.g., enable/disable isolation
        transistors to connect a selected memory and isolate an unused
        memory array)
    Deactivate Equilibrate (EQ)
    Activate InvD
    Deactivate InvD
    Disable Accumulator
    Enable Sense amplifier (e.g., Fire NPSA, after which Inverse RowX
        data resides in the sense amp)
    Activate Passd and Passdb
```

```
Enable Accumulator (e.g., after which Inverse RowX data resides
in
    the Accumulator)
Deactivate Passd and Passdb
Disable Sense amplifier (e.g., Close NPSA)
Reconfigure isolation transistors (e.g., disable/enable all isolation
    transistors)
Activate Equilibriate (EQ) to Precharge
```

Operating the isolation transistors was described previously with respect to FIG. 2. Operating the isolation transistors to select a particular one of a plurality of memory arrays (e.g., one of two) can provide additional flexibility and capability with respect to data value operations and transfer. According to various embodiments, by appropriate operation of the isolation transistors, a data value can be sensed from one memory array, inverted, and the result stored in another memory array, for example.

In an array architecture utilizing array/data line isolation device (e.g., isolation device 223 shown in FIG. 2), after Row X data is stored in the Accumulator, operations to invert the data in the compute component can be summarized as follows:

```
NOT (RowX) where all memory arrays are isolated
    Configure isolation transistors to disable all isolation transistors
    (e.g.,
        to isolate all memory arrays such that no data lines are coupled
    to
        the sense amplifier/compute component)
    Deactivate Equilibriate (EQ)
    Activate InvD
    Deactivate InvD
    Disable Accumulator
    Enable Sense amplifier (e.g., Fire NPSA, after which Inverse RowX
        data resides in the sense amp)
    Activate Passd and Passdb
    Enable Accumulator (e.g., after which Inverse RowX data resides
in
    the Accumulator)
    Deactivate Passd and Passdb
    Disable Sense amplifier (e.g., Close NPSA)
    Reconfigure isolation transistors (e.g., enable all isolation transis-
tors)
    Activate Equilibriate (EQ) to Precharge
```

Initially operating the isolation transistors to isolate all memory arrays has the advantage of effectively removing the capacitance of all the data lines of the memory arrays. Using this isolation transistor configuration, the INVERT operation can occur much faster. Also, since the capacitance of all data lines need not be charged, less power is used in the INVERT operation.

Figure 6:
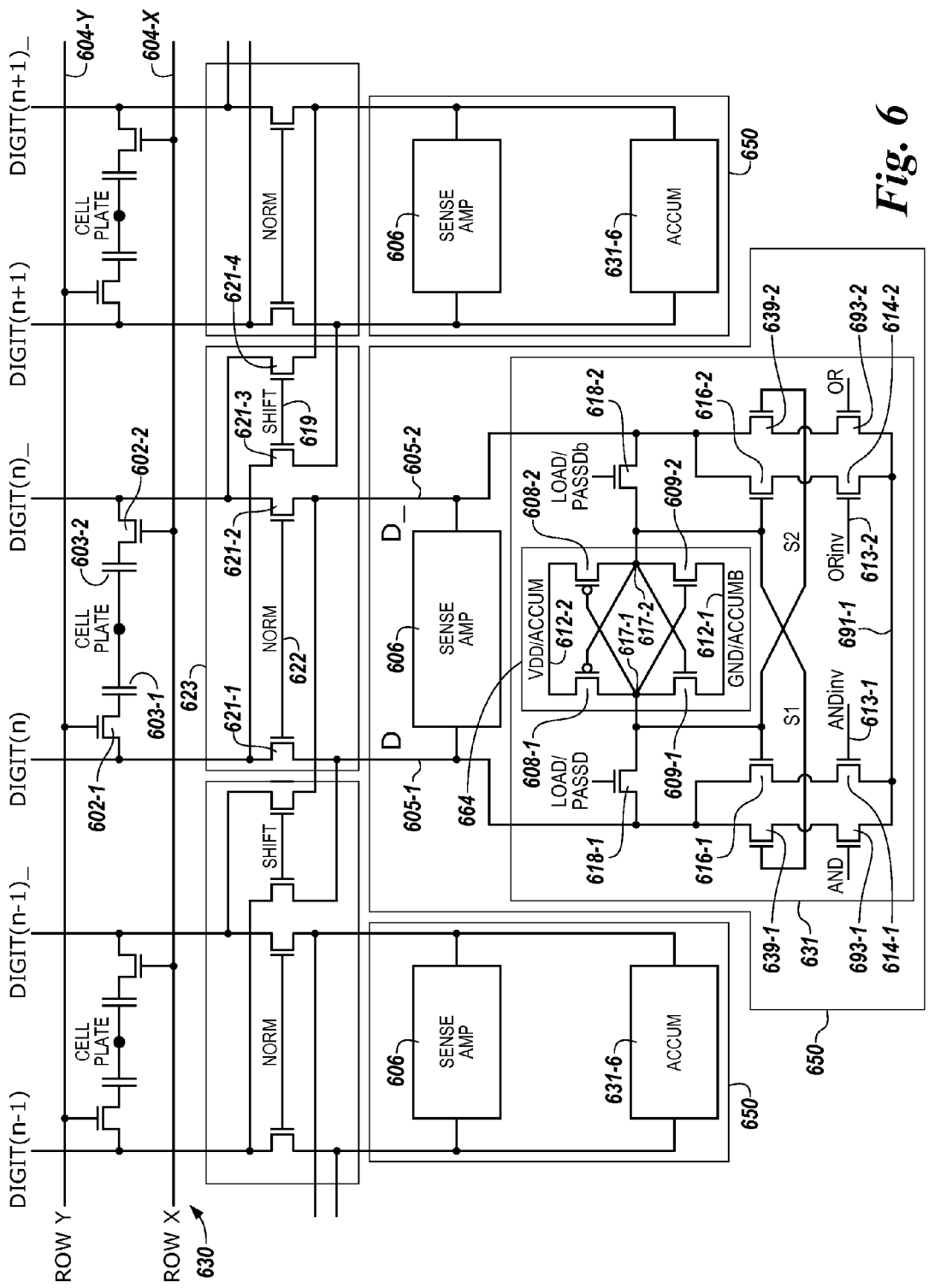
FIG. 6 is a schematic diagram illustrating sensing circuitry in accordance with a number of embodiments of the present disclosure.

FIG. 6 is a schematic diagram illustrating sensing circuitry in accordance with a number of embodiments of the present disclosure. A memory cell comprises a storage element (e.g., capacitor) and an access device (e.g., transistor). For instance, transistor 602-1 and capacitor 603-1 comprises a memory cell, and transistor 602-2 and capacitor 603-2 comprises a memory cell, etc. In this example, the memory array 630 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 630 are arranged in rows coupled by word lines 604-X (Row X), 604-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 605-1 (D) and 605-2 (D_) respectively. Although only three pair of complementary data lines are shown in FIG. 6, embodiments of the present disclosure are not so limited, and an array of memory cells can include additional columns of memory cells and/or data lines (e.g., 4,096, 8,192, 11,384, etc.).

Memory cells can be coupled to different data lines and/or word lines. For example, a first source/drain region of a transistor 602-1 can be coupled to data line 605-1 (D), a second source/drain region of transistor 602-1 can be coupled to capacitor 603-1, and a gate of a transistor 602-1 can be coupled to word line 604-X. A first source/drain region of a transistor 602-2 can be coupled to data line 605-2 (D_), a second source/drain region of transistor 602-2 can be coupled to capacitor 603-2, and a gate of a transistor 602-2 can be coupled to word line 604-Y. The cell plate, as shown in FIG. 6, can be coupled to each of capacitors 603-1 and 603-2. The cell plate can be a common node to which a reference voltage (e.g., ground) can be applied in various memory array configurations.

The memory array 630 is coupled to sensing circuitry 650 in accordance with a number of embodiments of the present disclosure. In this example, the sensing circuitry 650 comprises a sense amplifier 606 and a compute component 631 corresponding to respective columns of memory cells (e.g., coupled to respective pairs of complementary data lines). The sense amplifier 606 can comprise a cross coupled latch, which can be referred to herein as a primary latch. The sense amplifier 606 can be configured, for example, as described with respect to FIG. 7.

In the example illustrated in FIG. 6, the circuitry corresponding to compute component 631 comprises a static latch 664 and an additional ten transistors that implement, among other things, a dynamic latch. The dynamic latch and/or static latch of the compute component 631 can be collectively referred to herein as a secondary latch, which can serve as an accumulator. As such, the compute component 631 can operate as and/or be referred to herein as an accumulator. The compute component 631 can be coupled to each of the data lines D 605-1 and D_ 605-2 as shown in FIG. 6. However, embodiments are not limited to this example. The transistors of compute component 631 can all be n-channel transistors (e.g., NMOS transistors), for example.

In this example, data line D 605-1 can be coupled to a first source/drain region of transistors 616-1 and 639-1, as well as to a first source/drain region of load/pass transistor 618-1. Data line D_ 605-2 can be coupled to a first source/drain region of transistors 616-2 and 639-2, as well as to a first source/drain region of load/pass transistor 618-2.

The gates of load/pass transistor 618-1 and 618-2 can be commonly coupled to a LOAD control signal, or respectively coupled to a PASSD/PASSDB control signal, as discussed further below. A second source/drain region of load/pass transistor 618-1 can be directly coupled to the gates of transistors 616-1 and 639-2. A second source/drain region of load/pass transistor 618-2 can be directly coupled to the gates of transistors 616-2 and 639-1.

A second source/drain region of transistor 616-1 can be directly coupled to a first source/drain region of pull-down transistor 614-1. A second source/drain region of transistor 639-1 can be directly coupled to a first source/drain region of pull-down transistor 607-1. A second source/drain region of transistor 616-2 can be directly coupled to a first source/ drain region of pull-down transistor 614-2. A second source/ drain region of transistor 639-2 can be directly coupled to a first source/drain region of pull-down transistor 607-2. A second source/drain region of each of pull-down transistors 607-1, 607-2, 614-1, and 614-2 can be commonly coupled together to a reference voltage line 691-1 (e.g., ground (GND)). A gate of pull-down transistor 607-1 can be coupled to an AND control signal line, a gate of pull-down transistor 614-1 can be coupled to an ANDinv control signal line 613-1, a gate of pull-down transistor 614-2 can be coupled to an ORinv control signal line 613-2, and a gate of pull-down transistor 607-2 can be coupled to an OR control signal line.

The gate of transistor 639-1 can be referred to as node S1, and the gate of transistor 639-2 can be referred to as node S2. The circuit shown in FIG. 6 stores accumulator data dynamically on nodes S1 and S2. Activating the LOAD control signal causes load/pass transistors 618-1 and 618-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 6 is not contingent on the LOAD control signal being elevated to a voltage greater than $V_{DD}$.

The configuration of compute component 631 shown in FIG. 6 has the benefit of balancing the sense amplifier for functionality when the pull-down transistors 607-1, 607-2, 614-1, and 614-2 are conducting before the sense amplifier 606 is fired (e.g., during pre-seeding of the sense amplifier 606). As used herein, firing the sense amplifier 606 refers to enabling the sense amplifier 606 to set the primary latch and subsequently disabling the sense amplifier 606 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 616-1 (having a gate coupled to S2 of the dynamic latch) in series with transistor 614-1 (having a gate coupled to an ANDinv control signal line 613-1) can be operated to pull-down data line 605-1 (D), and transistor 616-2 (having a gate coupled to S1 of the dynamic latch) in series with transistor 614-2 (having a gate coupled to an ANDinv control signal line 613-2) can be operated to pull-down data line 605-2 (D_).

The latch 664 can be controllably enabled by coupling to an active negative control signal line 612-1 (ACCUMB) and an active positive control signal line 612-2 (ACCUM) rather than be configured to be continuously enabled by coupling to ground and $V_{DD}$. In various embodiments, load/pass transistors 608-1 and 608-2 can each having a gate coupled to one of a LOAD control signal or a PASSD/PASSDB control signal.

According to some embodiments, the gates of load/pass transistors 618-1 and 618-2 can be commonly coupled to a LOAD control signal. In the configuration where the gates of load/pass transistors 618-1 and 618-2 are commonly coupled to the LOAD control signal, transistors 618-1 and 618-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 6 is not contingent on the LOAD control signal being elevated to a voltage greater than $V_{DD}$.

According to some embodiments, the gate of load/pass transistor 618-1 can be coupled to a PASSD control signal, and the gate of load/pass transistor 618-2 can be coupled to a PASSDb control signal. In the configuration where the gates of transistors 618-1 and 618-2 are respectively coupled to one of the PASSD and PASSDb control signals, transistors 618-1 and 618-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 623, as shown in FIG. 6). According to some embodiments, load/pass transistors 618-1 and 618-2 can be configured to accommodate the heavier loading corresponding to a pass transistor but be coupled and operated as a load transistor. Load/pass transistors 618-1 and 618-2 configured as pass transistors can also be utilized as load transistors. However, load/pass transistors 618-1 and 618-2 configured as load transistors may not be capable of being utilized as pass transistors.

In a number of embodiments, the compute component 631, including the latch 664, can comprise a number of transistors formed on pitch with the transistors of the corresponding memory cells of an array (e.g., array 630 shown in FIG. 6) to which they are coupled, which may conform to a particular feature size (e.g., $4F^2$, $6F^2$, etc.). According to various embodiments, latch 664 includes four transistors 608-1, 608-2, 609-1, and 609-2 coupled to a pair of complementary data lines D 605-1 and D_ 605-2 through load/pass transistors 618-1 and 618-2. However, embodiments are not limited to this configuration. The latch 664 can be a cross coupled latch (e.g., gates of a pair of transistors, such as n-channel transistors (e.g., NMOS transistors) 609-1 and 609-2 are cross coupled with the gates of another pair of transistors, such as p-channel transistors (e.g., PMOS transistors) 608-1 and 608-2). As described further herein, the cross coupled latch 664 can be referred to as a static latch.

The voltages or currents on the respective data lines D and D_ can be provided to the respective latch inputs 617-1 and 617-2 of the cross coupled latch 664 (e.g., the input of the secondary latch). In this example, the latch input 617-1 is coupled to a first source/drain region of transistors 608-1 and 609-1 as well as to the gates of transistors 608-2 and 609-2. Similarly, the latch input 617-2 can be coupled to a first source/drain region of transistors 608-2 and 609-2 as well as to the gates of transistors 608-1 and 609-1.

Figure 7:
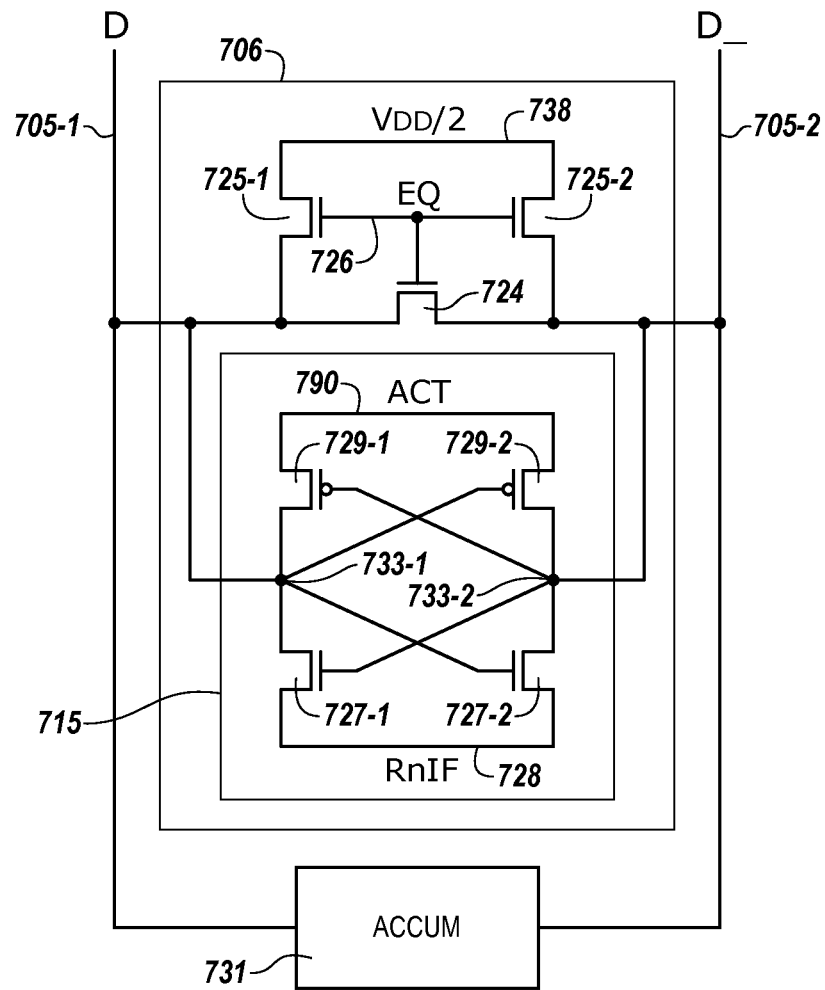
FIG. 7 is a schematic diagram illustrating a portion of sensing circuitry in accordance with a number of embodiments of the present disclosure.

In this example, a second source/drain region of transistor 609-1 and 609-2 is commonly coupled to a negative control signal line 612-1 (e.g., ground (GND) or ACCUMB control signal similar to control signal RnIF shown in FIG. 7 with respect to the primary latch). A second source/drain region of transistors 608-1 and 608-2 is commonly coupled to a positive control signal line 612-2 (e.g., $V_{DD}$ or ACCUM control signal similar to control signal ACT shown in FIG. 7 with respect to the primary latch). The positive control signal 612-2 can provide a supply voltage (e.g., $V_{DD}$) and the negative control signal 612-1 can be a reference voltage (e.g., ground) to enable the cross coupled latch 664. According to some embodiments, the second source/drain region of transistors 608-1 and 608-2 are commonly coupled directly to the supply voltage (e.g., $V_{DD}$), and the second source/drain region of transistor 609-1 and 609-2 are commonly coupled directly to the reference voltage (e.g., ground) so as to continuously enable latch 664.

The enabled cross coupled latch 664 operates to amplify a differential voltage between latch input 617-1 (e.g., first common node) and latch input 617-2 (e.g., second common node) such that latch input 617-1 is driven to either the activated positive control signal voltage (e.g., $V_{DD}$) or the activated negative control signal voltage (e.g., ground), and latch input 617-2 is driven to the other of the activated positive control signal voltage (e.g., $V_{DD}$) or the activated negative control signal voltage (e.g., ground).

FIG. 7 is a schematic diagram illustrating a portion of sensing circuitry in accordance with a number of embodiments of the present disclosure. According to various embodiments, sense amplifier 606 can comprise a cross coupled latch. However, embodiments of the sense amplifier 706 are not limited to a cross coupled latch. As an example, the sense amplifier 706 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 706) can comprise a number of transistors formed on pitch with the transistors of the corresponding compute component 731 and/or the memory cells of an array (e.g., 630 shown in FIG. 6) to which they are coupled, which may conform to a particular feature size (e.g., $4F^2$, $6F^2$, etc.). The sense amplifier 706 comprises a latch 715 including four transistors coupled to a pair of complementary data lines D 705-1 and D_ 705-2. The latch 715 can be a cross coupled latch (e.g., gates of a pair of transistors, such as n-channel transistors (e.g., NMOS transistors) 727-1 and 727-2 are cross coupled with the gates of another pair of transistors, such as p-channel transistors (e.g., PMOS transistors) 729-1 and 729-2). As described further herein, the latch 715 comprising transistors 727-1, 727-2, 729-1, and 729-2 can be referred to as a primary latch. However, embodiments are not limited to this example.

The voltages or currents on the respective data lines D and D_ can be provided to the respective latch inputs 733-1 and 733-2 of the cross coupled latch 715 (e.g., the input of the secondary latch). In this example, the latch input 733-1 is coupled to a first source/drain region of transistors 727-1 and 729-1 as well as to the gates of transistors 727-2 and 729-2. Similarly, the latch input 733-2 can be coupled to a first source/drain region of transistors 727-2 and 729-2 as well as to the gates of transistors 727-1 and 729-1. The compute component 733 (e.g., accumulator) can be coupled to latch inputs 733-1 and 733-2 of the cross coupled latch 715 as shown; however, embodiments are not limited to the example shown in FIG. 7.

In this example, a second source/drain region of transistor 727-1 and 727-2 is commonly coupled to an active negative control signal 728 (RnIF) A second source/drain region of transistors 729-1 and 729-2 is commonly coupled to an active positive control signal 790 (ACT). The ACT signal 790 can be a supply voltage (e.g., $V_{DD}$) and the RnIF signal can be a reference voltage (e.g., ground). Activating signals 728 and 790 enables the cross coupled latch 715.

The enabled cross coupled latch 715 operates to amplify a differential voltage between latch input 733-1 (e.g., first common node) and latch input 733-2 (e.g., second common node) such that latch input 733-1 is driven to one of the ACT signal voltage and the RnIF signal voltage (e.g., to one of $V_{DD}$ and ground), and latch input 733-2 is driven to the other of the ACT signal voltage and the RnIF signal voltage.

The sense amplifier 706 can also include circuitry configured to equilibrate the data lines D and D_ (e.g., in association with preparing the sense amplifier for a sensing operation). In this example, the equilibration circuitry comprises a transistor 724 having a first source/drain region coupled to a first source/drain region of transistor 725-1 and data line D 705-1. A second source/drain region of transistor 724 can be coupled to a first source/drain region of transistor 725-2 and data line D_ 705-2. A gate of transistor 724 can be coupled to gates of transistors 725-1 and 725-2.

The second source drain regions of transistors 725-1 and 725-2 are coupled to an equilibration voltage 738 (e.g., $V_{DD}/2$), which can be equal to $V_{DD}/2$, where $V_{DD}$ is a supply voltage associated with the array. The gates of transistors 724, 725-1, and 725-2 can be coupled to control signal 725 (EQ). As such, activating EQ enables the transistors 724, 725-1, and 725-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., accumulator).

As shown in FIG. 6, the sense amplifier 606 and the compute component 631 can be coupled to the array 630 via shift circuitry 623. In this example, the shift circuitry 623 comprises a pair of isolation devices (e.g., isolation transistors 621-1 and 621-2) coupled to data lines 605-1 (D) and 605-2 (D_), respectively). The isolation transistors 621-1 and 621-2 are coupled to a control signal 622 (NORM) that, when activated, enables (e.g., turns on) the isolation transistors 621-1 and 621-2 to couple the corresponding sense amplifier 606 and compute component 631 to a corresponding column of memory cells (e.g., to a corresponding pair of complementary data lines 605-1 (D) and 605-2 (D_)). According to various embodiments, conduction of isolation transistors 621-1 and 621-2 can be referred to as a "normal" configuration of the shift circuitry 623.

In the example illustrated in FIG. 6, the shift circuitry 623 includes another (e.g., a second) pair of isolation devices (e.g., isolation transistors 621-3 and 621-4) coupled to a complementary control signal 619 (SHIFT), which can be activated, for example, when NORM is deactivated. The isolation transistors 621-3 and 621-4 can be operated (e.g., via control signal 619) such that a particular sense amplifier 606 and compute component 631 are coupled to a different pair of complementary data lines (e.g., a pair of complementary data lines different than the pair of complementary data lines to which isolation transistors 621-1 and 621-2 couple the particular sense amplifier 606 and compute component 631), or can couple a particular sense amplifier 606 and compute component 631 to another memory array (and isolate the particular sense amplifier 606 and compute component 631 from a first memory array). According to various embodiments, the shift circuitry 623 can be arranged as a portion of (e.g., within) the sense amplifier 606, for instance.

Although the shift circuitry 623 shown in FIG. 6 includes isolation transistors 621-1 and 621-2 used to couple particular sensing circuitry 650 (e.g., a particular sense amplifier 606 and corresponding compute component 631) to a particular pair of complementary data lines 605-1 (D) and 605-2 (D_) (e.g., DIGIT(n) and DIGIT(n)_) and isolation transistors 621-3 and 621-4 are arranged to couple the particular sensing circuitry 650 to an adjacent pair of complementary data lines in one particular direction (e.g., adjacent data lines DIGIT(n+1) and DIGIT(n+1)_ shown to the right in FIG. 6), embodiments of the present disclosure are not so limited. For instance, shift circuitry can include isolation transistors 621-1 and 621-2 used to couple particular sensing circuitry to a particular pair of complementary data lines (e.g., DIGIT(n) and DIGIT(n)_ and isolation transistors 621-3 and 621-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 6).

Embodiments of the present disclosure are not limited to the configuration of shift circuitry 623 shown in FIG. 6. In a number of embodiments, shift circuitry 623 such as that shown in FIG. 6 can be operated (e.g., in conjunction with sense amplifiers 606 and compute components 631) in association with performing compute functions such as adding and subtracting functions without transferring data out of the sensing circuitry 650 via an I/O line (e.g., local I/O line (IO/IO_)), for instance.

Although not shown in FIG. 6, each column of memory cells can be coupled to a column decode line that can be activated to transfer, via local I/O line, a data value from a corresponding sense amplifier 606 and/or compute component 631 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 623 can be operated in conjunction with sense amplifiers 606 and compute components 631 to perform compute functions such as adding and subtracting functions without transferring data to a control component external to the array, for instance.

The sensing circuitry 650 can be operated in several modes to perform logical operations, including a first mode in which a result of the logical operation is initially stored in the sense amplifier 606, and a second mode in which a result of the logical operation is initially stored in the compute component 631. Operation of the sensing circuitry 650 in the first mode is described below with respect to FIGS. 3 and 4, and operation of the sensing circuitry 650 in the second mode is described in part above with respect to FIGS. 4-5 (above) and described in part below with respect to FIGS. 10-12. Additionally with respect to the first operating mode, sensing circuitry 650 can be operated in both pre-sensing (e.g., sense amps fired before logical operation control signal active) and post-sensing (e.g., sense amps fired after logical operation control signal active) modes with a result of a logical operation being initially stored in the sense amplifier 606.

As described further below, the sense amplifier 606 can, in conjunction with the compute component 631, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The functionality of the sensing circuitry 650 of FIG. 6 is described below and summarized in Table 1 below with respect to performing logical operations and initially storing a result in the sense amplifier 606. Initially storing the result of a particular logical operation in the primary latch of sense amplifier 606 can provide improved versatility as compared to previous approaches in which the result may initially reside in a secondary latch (e.g., accumulator) of a compute component 631, and then be subsequently transferred to the sense amplifier 606, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 606 (e.g., without having to perform an additional operation to move the result from the compute component 631 (e.g., accumulator) to the sense amplifier 606) is advantageous because, for instance, the result can be written to a row (of the array of memory cells) or back into the accumulator without performing a precharge cycle (e.g., on the complementary data lines 605-1 (D) and/or 605-2 (D_)).

Figure 8:
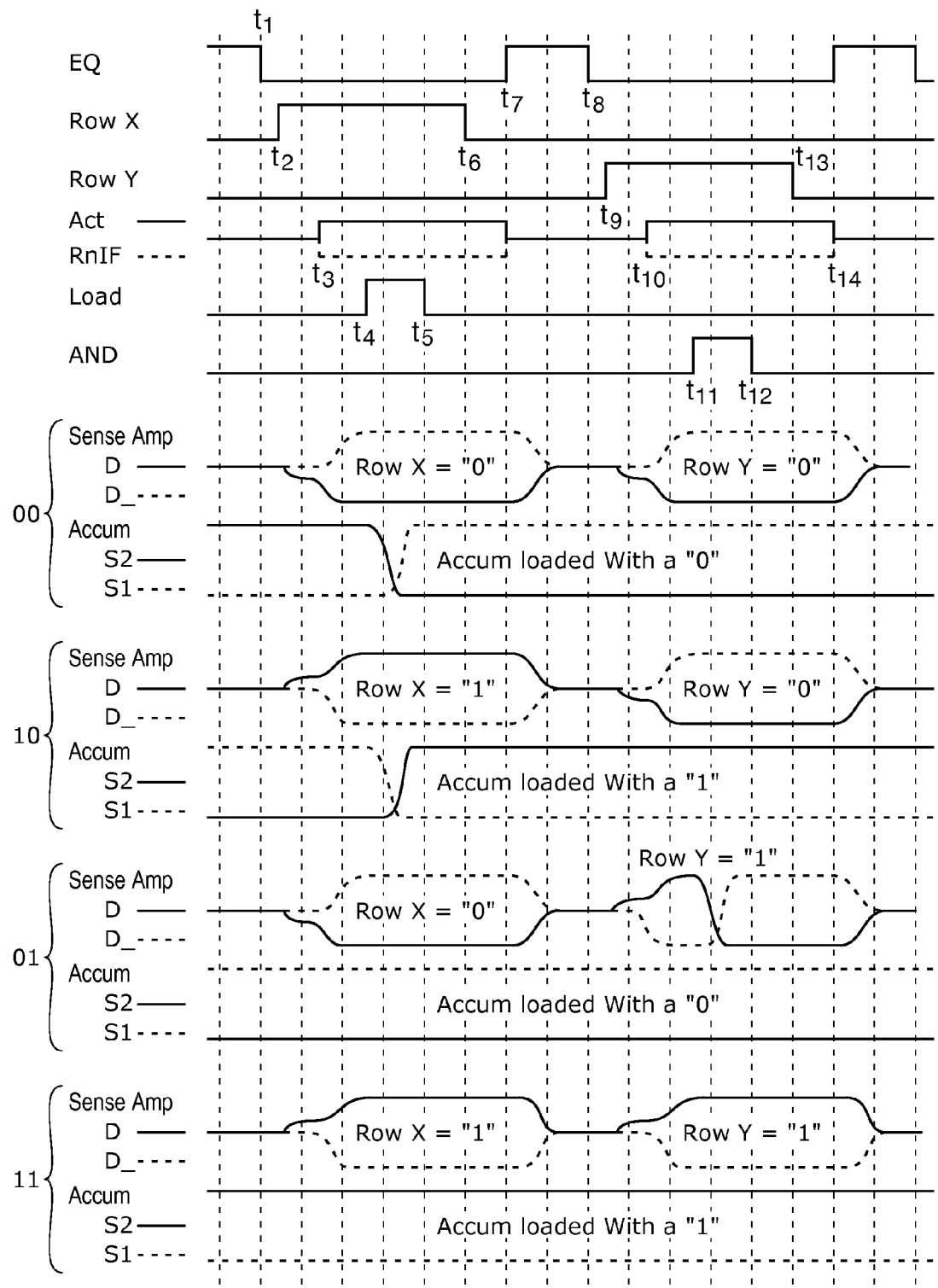
FIG. 8 illustrates a timing diagram associated with performing a number of logical operations using sensing circuitry in accordance with a number of embodiments of the present disclosure.

FIG. 8 illustrates a timing diagram associated with performing a number of logical operations using sensing circuitry in accordance with a number of embodiments of the present disclosure. FIG. 8 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 8 illustrates a number of control signals associated with operating sensing circuitry (e.g., 650) to perform the AND logical operation. "EQ" corresponds to an equilibrate signal applied to the sense amplifier 606, "ROW X" corresponds to an activation signal applied to access line 604-X, "ROW Y" corresponds to an activation signal applied to access line 604-Y, "Act" and "RnIF" correspond to a respective active positive and negative control signal applied to the sense amplifier 606, "LOAD" corresponds to a load control signal (e.g., LOAD/PASSD and LOAD/PASSDb shown in FIG. 6), and "AND" corresponds to the AND control signal shown in FIG. 6. FIG. 8 also illustrates the waveform diagrams showing the signals (e.g., voltage signals) on the digit lines D and D_corresponding to sense amplifier 606 and on the nodes S1 and S2 corresponding to the compute component 631 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 6.

An example of pseudo code associated with loading (e.g., copying) a first data value stored in a cell coupled to row 604-X into the accumulator can be summarized as follows:

---

Copy Row X into the Accumulator:
    Deactivate EQ
    Enable Row X
    Fire Sense Amps (after which Row X data resides in the sense amps)
    Activate LOAD (sense amplifier data (Row X) is transferred to nodes
        S1 and S2 of the Accumulator and resides there dynamically)
    Deactivate LOAD
    Disable Row X
    Precharge

---

In the pseudo code above, "Deactivate EQ" indicates that an equilibration signal (EQ signal shown in FIG. 8) corresponding to the sense amplifier 606 is disabled at $t_1$ as shown in FIG. 8 (e.g., such that the complementary data lines (e.g., 605-1 (D) and 605-2 (D_) are no longer shorted to $V_{DD}/2$). After equilibration is disabled, a selected row (e.g., ROW X) is enabled (e.g., selected, opened such as by activating a signal to select a particular row) as indicated by "Enable Row X" in the pseudo code and shown at $t_2$ for signal Row X in FIG. 8. When the voltage signal applied to ROW X reaches the threshold voltage (Vt) of the access transistor (e.g., 602-2) corresponding to the selected cell, the access transistor turns on and couples the data line (e.g., 605-2 (D_)) to the selected cell (e.g., to capacitor 603-2) which creates a differential voltage signal between the data lines.

After Row X is enabled, in the pseudo code above, "Fire Sense Amps" indicates that the sense amplifier 606 is enabled to set the primary latch and subsequently disabled. For example, as shown at $t_3$ in FIG. 8, the ACT positive control signal (e.g., 790 shown in FIG. 7) goes high and the RnIF negative control signal (e.g., 728 shown in FIG. 7) goes low, which amplifies the differential signal between 605-1 (D) and D_ 605-2, resulting in a voltage (e.g., $V_{DD}$) corresponding to a logic 1 or a voltage (e.g., GND) corresponding to a logic 0 being on data line 605-1 (D) (and the voltage corresponding to the other logic state being on complementary data line 605-2 (D_)). The sensed data value is stored in the primary latch of sense amplifier 606. The primary energy consumption occurs in charging the data lines (e.g., 605-1 (D) or 605-2 (D_)) from the equilibration voltage $V_{DD}/2$ to the rail voltage $V_{DD}$.

The four sets of possible sense amplifier and accumulator signals illustrated in FIG. 8 (e.g., one for each combination of Row X and Row Y data values) shows the behavior of signals on data lines D and D_. The Row X data value is stored in the primary latch of the sense amp. It should be noted that FIG. 6 shows that the memory cell including storage element 602-2, corresponding to Row X, is coupled to the complementary data line D_, while the memory cell including storage element 602-1, corresponding to Row Y, is coupled to data line D. However, as can be seen in FIG. 6, the charge stored in memory cell 602-2 (corresponding to Row X) corresponding to a "0" data value causes the voltage on data line D_ (to which memory cell 602-2 is coupled) to go high and the charge stored in memory cell 602-2 corresponding to a "1" data value causes the voltage on data line D_ to go low, which is opposite correspondence between data states and charge stored in memory cell 602-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 8, causing load/pass transistors 618-1 and 618-2 to conduct. In this manner, activating the LOAD control signal enables the secondary latch in the accumulator of the compute component 631. The sensed data value stored in the sense amplifier 606 is transferred (e.g., copied) to the secondary latch. As shown for each of the four sets of possible sense amplifier and accumulator signals illustrated in FIG. 8, the behavior at inputs of the secondary latch of the accumulator indicates the secondary latch is loaded with the Row X data value. As shown in FIG. 8, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 605-1 (D) and 605-2 (D_), in the pseudo code above, "Deactivate LOAD" indicates that the LOAD control signal goes back low as shown at $t_5$ in FIG. 8 to cause the load/pass transistors 618-1 and 618-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Disable Row X" and indicated at $t_6$ in FIG. 8, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 8 by the EQ signal going high at $t_7$. As shown in each of the four sets of possible sense amplifier and accumulator signals illustrated in FIG. 8 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 606 and the secondary latch of the compute component 631) and the second data value (stored in a memory cell 602-1 coupled to Row Y 604-Y) includes performing particular steps which depend on the whether an AND or an OR is to be performed. Examples of pseudo code associated with "ANDing" and "ORing" the data value residing in the accumulator (e.g., the first data value stored in the memory cell 602-2 coupled to Row X 604-X) and the second data value (e.g., the data value stored in the memory cell 602-1 coupled to Row Y 604-Y) are summarized below. Example pseudo code associated with "ANDing" the data values can include:

Deactivate EQ
Enable Row Y
Fire Sense Amps (after which Row Y data resides in the sense amps)
Disable Row Y
   The result of the logic operation, in the next operation, will be placed
      on the sense amp, which will overwrite any row that is active.
   Even when Row Y is closed, the sense amplifier still contains the
      Row Y data value.
Activate AND
   This results in the sense amplifier being written to the value of the
      function (e.g., Row X AND Row Y)
   If the accumulator contains a "0" (i.e., a voltage corresponding to a
      "0" on node S2 and a voltage corresponding to a "1" on node
      S1),
         the sense amplifier data is written to a "0"
   If the accumulator contains a "1" (i.e., a voltage corresponding to a
      "1" on node S2 and a voltage corresponding to a "0" on node
      S1),
         the sense amplifier data remains unchanged (Row Y data)
   This operation leaves the data in the accumulator unchanged.
Deactivate AND
Precharge In the pseudo code above, "Deactivate EQ" indicates that an equilibration signal corresponding to the sense amplifier 606 is disabled (e.g., such that the complementary data lines 605-1 (D) and 605-2 (D_) are no longer shorted to $V_{DD}/2$), which is illustrated in FIG. 8 at $t_8$. After equilibration is disabled, a selected row (e.g., ROW Y) is enabled as indicated in the pseudo code above by "Enable Row Y" and shown in FIG. 8 at $t_9$. When the voltage signal applied to ROW Y reaches the threshold voltage (Vt) of the access transistor (e.g., 602-1) corresponding to the selected cell, the access transistor turns on and couples the data line (e.g., D_ 605-1) to the selected cell (e.g., to capacitor 603-1) which creates a differential voltage signal between the data lines.

After Row Y is enabled, in the pseudo code above, "Fire Sense Amps" indicates that the sense amplifier 606 is enabled to amplify the differential signal between 605-1 (D) and 605-2 (D_), resulting in a voltage (e.g., $V_{DD}$) corresponding to a logic 1 or a voltage (e.g., GND) corresponding to a logic 0 being on data line 605-1 (D) (and the voltage corresponding to the other logic state being on complementary data line 605-2 (D_)). As shown at $t_{10}$ in FIG. 8, the ACT positive control signal (e.g., 790 shown in FIG. 7) goes high and the RnIF negative control signal (e.g., 728 shown in FIG. 7) goes low to fire the sense amps. The sensed data value from memory cell 602-1 is stored in the primary latch of sense amplifier 606, as previously described. The secondary latch still corresponds to the data value from memory cell 602-2 since the dynamic latch is unchanged.

After the second data value sensed from the memory cell 602-1 coupled to Row Y is stored in the primary latch of sense amplifier 606, in the pseudo code above, "Disable Row Y" indicates that the selected row (e.g., ROW Y) can be disabled if it is not desired to store the result of the AND logical operation back in the memory cell corresponding to Row Y. However, FIG. 8 shows that Row Y is left enabled such that the result of the logical operation can be stored back in the memory cell corresponding to Row Y. Isolating the memory cell corresponding to Row Y can be accomplished by the access transistor turning off to decouple the selected cell 602-1 from the data line 605-1 (D). After the selected Row Y is configured (e.g., to isolate the memory cell or not isolate the memory cell), "Activate AND" in the pseudo code above indicates that the AND control signal goes high as shown in FIG. 8 at $t_{11}$, causing pass transistor 607-1 to conduct. In this manner, activating the AND control signal causes the value of the function (e.g., Row X AND Row Y) to be written to the sense amp.

With the first data value (e.g., Row X) stored in the dynamic latch of the accumulator 631 and the second data value (e.g., Row Y) stored in the sense amplifier 606, if the dynamic latch of the compute component 631 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 609-1 to conduct thereby coupling the sense amplifier 606 to ground through transistor 609-1, pass transistor 607-1 and data line 605-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 606. This operation leaves the data value in the accumulator unchanged (e.g., from Row X).

If the secondary latch of the accumulator contains a "1" (e.g., from Row X), then the result of the AND operation depends on the data value stored in the sense amplifier 606 (e.g., from Row Y). The result of the AND operation should be a "1" if the data value stored in the sense amplifier 606 (e.g., from Row Y) is also a "1," but the result of the AND operation should be a "0" if the data value stored in the sense amplifier 606 (e.g., from Row Y) is also a "0." The sensing circuitry 650 is configured such that if the dynamic latch of the accumulator contains a "1" (i.e., a voltage corresponding to a "1" on node S2 and a voltage corresponding to a "0" on node S1), transistor 609-1 does not conduct, the sense amplifier is not coupled to ground (as described above), and the data value previously stored in the sense amplifier 606 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 606, "Deactivate AND" in the pseudo code above indicates that the AND control signal goes low as shown at $t_{12}$ in FIG. 8, causing pass transistor 607-1 to stop conducting to isolate the sense amplifier 606 (and data line 605-1 (D)) from ground. If not previously done, Row Y can be closed (as shown at $t_{13}$ in FIG. 8) and the sense amplifier can be disabled (as shown at $t_{14}$ in FIG. 8 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 8).

FIG. 8 shows, in the alternative, the behavior of voltage signals on the data lines (e.g., 605-1 (D) and 605-2 (D_) shown in FIG. 6) coupled to the sense amplifier (e.g., 606 shown in FIG. 6) and the behavior of voltage signals on nodes S1 and S1 of the secondary latch of the compute component (e.g., 631 shown in FIG. 6) for an AND logical operation involving each of the possible combination of operands (e.g., Row X/Row Y data values 00, 10, 01, and 11).

Although the timing diagrams illustrated in FIG. 8 and the pseudo code described above indicate initiating the AND logical operation after starting to load the second operand (e.g., Row Y data value) into the sense amplifier, the circuit shown in FIG. 6 can be successfully operated by initiating the AND logical operation before starting to load the second operand (e.g., Row Y data value) into the sense amplifier.

Figure 9:
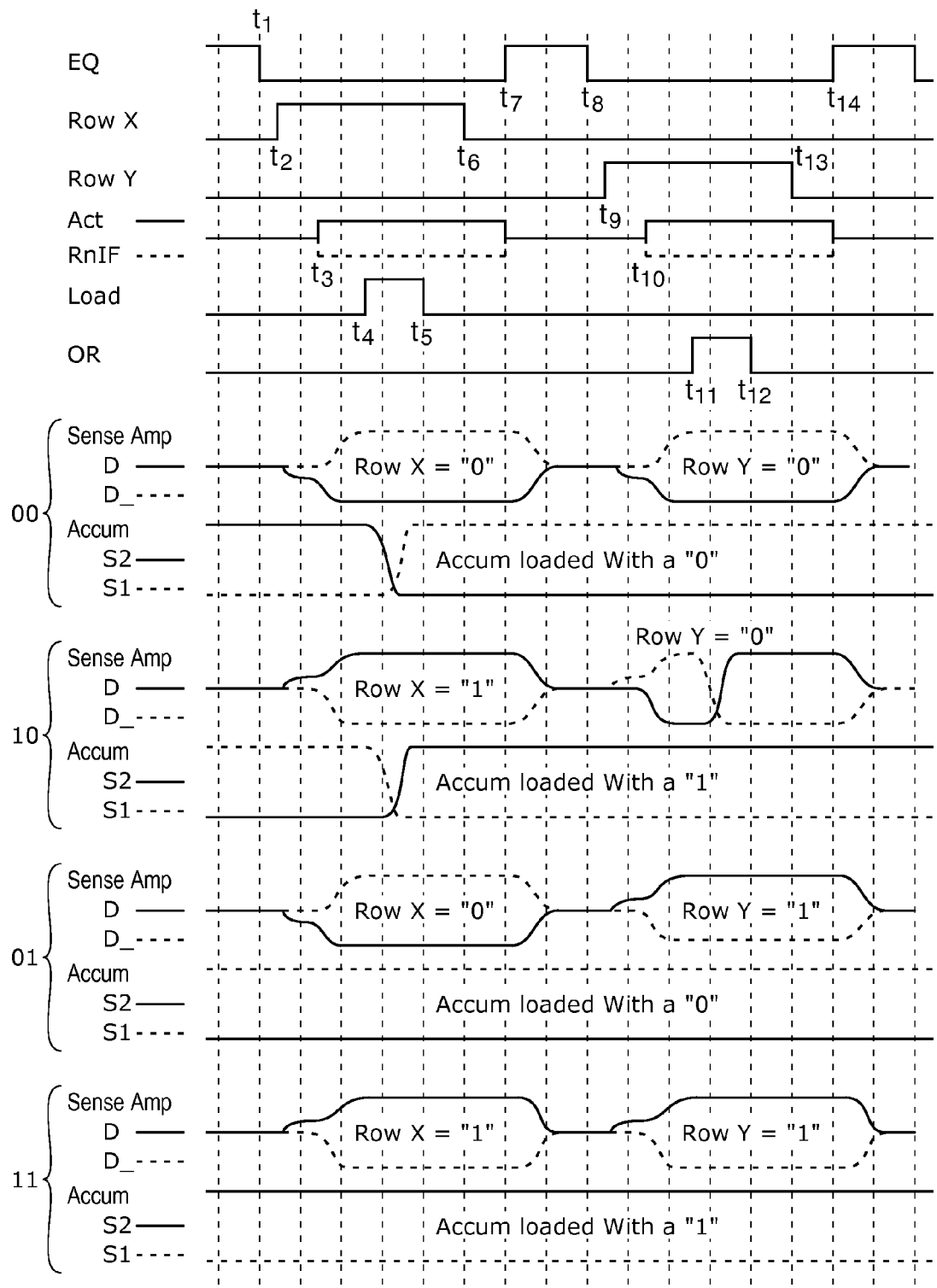
FIG. 9 illustrates a timing diagram associated with performing a number of logical operations using sensing circuitry in accordance with a number of embodiments of the present disclosure.

FIG. 9 illustrates a timing diagram associated with performing a number of logical operations using sensing circuitry in accordance with a number of embodiments of the present disclosure. FIG. 9 illustrates a timing diagram associated with initiating an OR logical operation after starting to load the second operand (e.g., Row Y data value) into the sense amplifier. FIG. 9 illustrates the sense amplifier and accumulator signals for various combinations of first and second operand data values. The particular timing diagram signals are discussed below with respect to the pseudo code associated with an AND logical operation of the circuit shown in FIG. 6.

A subsequent operation phase can alternately be associated with performing the OR operation on the first data value (now stored in the sense amplifier 606 and the secondary latch of the compute component 631) and the second data value (stored in a memory cell 602-1 coupled to Row Y 604-Y). The operations to load the Row X data into the sense amplifier and accumulator that were previously described with respect to times $t_1$-$t_7$ shown in FIG. 8 are not repeated with respect to FIG. 9. Example pseudo code associated with "ORing" the data values can include:

Deactivate EQ
Enable Row Y
Fire Sense Amps (after which Row Y data resides in the sense amps)
Disable Row Y
   When Row Y is closed, the sense amplifier still contains the Row Y
     data value.
Activate OR
   This results in the sense amplifier being written to the value of the
     function (e.g., Row X OR Row Y), which may overwrite the data
     value from Row Y previously stored in the sense amplifier as
     follows:
   If the accumulator contains a "0" (i.e., a voltage corresponding to a
     "0" on node S2 and a voltage corresponding to a "1" on node
     S1),
     the sense amplifier data remains unchanged (Row Y data)
   If the accumulator contains a "1" (i.e., a voltage corresponding to a
     "1" on node S2 and a voltage corresponding to a "0" on node
     S1),
     the sense amplifier data is written to a "1"
   This operation leaves the data in the accumulator unchanged.
Deactivate OR
Precharge The "Deactivate EQ" (shown at $t_8$ in FIG. 9), "Enable Row Y" (shown at $t_9$ in FIG. 9), "Fire Sense Amps" (shown at $t_{10}$ in FIG. 9), and "Disable Row Y" (shown at $t_{13}$ in FIG. 9, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 9, which causes pass transistor 607-2 to conduct. In this manner, activating the OR control signal causes the value of the function (e.g., Row X OR Row Y) to be written to the sense amp.

With the first data value (e.g., Row X) stored in the secondary latch of the compute component 631 and the second data value (e.g., Row Y) stored in the sense amplifier 606, if the dynamic latch of the accumulator contains a "0" (i.e., a voltage corresponding to a "0" on node S2 and a voltage corresponding to a "1" on node S1), then the result of the OR operation depends on the data value stored in the sense amplifier 606 (e.g., from Row Y). The result of the OR operation should be a "1" if the data value stored in the sense amplifier 606 (e.g., from Row Y) is a "1," but the result of the OR operation should be a "0" if the data value stored in the sense amplifier 606 (e.g., from Row Y) is also a "0." The sensing circuitry 650 is configured such that if the dynamic latch of the accumulator contains a "0," with the voltage corresponding to a "0" on node S2, transistor 609-2 is off and does not conduct (and pass transistor 607-1 is also off since the AND control signal is not asserted) so the sense amplifier 606 is not coupled to ground (either side), and the data value previously stored in the sense amplifier 606 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 609-2 does conduct (as does pass transistor 607-2 since the OR control signal is asserted), and the sense amplifier 606 input coupled to data line 605-2 (D_) is coupled to ground since the voltage corresponding to a "1" on node S2 causes transistor 609-2 to conduct along with pass transistor 607-2 (which also conducts since the OR control signal is asserted). In this manner, a "1" is initially stored in the sense amplifier 606 as a result of the OR operation when the secondary latch of the accumulator contains a "1" regardless of the data value previously stored in the sense amp. This operation leaves the data in the accumulator unchanged. FIG. 9 shows, in the alternative, the behavior of voltage signals on the data lines (e.g., 605-1 (D) and 605-2 (D_) shown in FIG. 6) coupled to the sense amplifier (e.g., 606 shown in FIG. 6) and the behavior of voltage signals on nodes S1 and S2 of the secondary latch of the compute component 631 for an OR logical operation involving each of the possible combination of operands (e.g., Row X/Row Y data values 00, 10, 01, and 11).

After the result of the OR operation is initially stored in the sense amplifier 606, "Deactivate OR" in the pseudo code above indicates that the OR control signal goes low as shown at $t_{12}$ in FIG. 9, causing pass transistor 607-2 to stop conducting to isolate the sense amplifier 606 (and data line D 605-2) from ground. If not previously done, Row Y can be closed (as shown at $t_{13}$ in FIG. 9) and the sense amplifier can be disabled (as shown at $t_{14}$ in FIG. 9 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 9.

The sensing circuitry 650 illustrated in FIG. 6 can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 614-1 to conduct and activating the ANDinv control signal causes transistor 614-2 to conduct. In each case, asserting the appropriate inverted control signal can flip the sense amplifier and cause the result initially stored in the sense amplifier 606 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 6 can perform a NOT (e.g., invert) operation by putting the non-inverted data value into the dynamic latch of the accumulator and using that data to invert the data value in the sense amplifier 606. As previously mentioned, activating the ORinv control signal causes transistor 614-1 to conduct and activating the ANDinv control signal causes transistor 614-2 to conduct. The ORinv and/or ANDinv control signals are used in implementing the NOT function, as described further below:

Copy Row X into the Accumulator
  Deactivate EQ
  Enable Row X
  Fire Sense Amps (after which Row X data resides in the sense amps)
  Activate LOAD (sense amplifier data (Row X) is transferred to nodes
    S1 and S2 of the Accumulator and resides there dynamically
  Deactivate LOAD
  Activate ANDinv and ORinv (which puts the compliment data value
    on the data lines)
      This results in the data value in the sense amplifier being inverted
        (e.g., the sense amplifier latch is flipped)
        This operation leaves the data in the accumulator unchanged
  Deactivate ANDinv and ORinv
  Disable Row X
  Precharge The "Deactivate EQ," "Enable Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and precharging after the Row X data is loaded into the sense amplifier 606 and copied into the dynamic latch, a compliment version of the data value in the dynamic latch of the accumulator can be placed on the data line and thus transferred to the sense amplifier 606 by enabling (e.g., causing transistor to conduct) and disabling the invert transistors (e.g., ANDinv and ORinv). This results in the sense amplifier 606 being flipped from the true data value that was previously stored in the sense amplifier to a compliment data value (e.g., inverted data value) stored in the sense amp. That is, a true or compliment version of the data value in the accumulator can be transferred to the sense amplifier by activating and deactivating ANDinv and ORinv. This operation leaves the data in the accumulator unchanged.

Because the sensing circuitry 650 shown in FIG. 6 initially stores the result of the AND, OR, and NOT logical operations in the sense amplifier 606 (e.g., on the sense amplifier nodes), these logical operation results can be communicated easily and quickly to any enabled row, any row activated after the logical operation is complete, and/or into the secondary latch of the compute component 631. The sense amplifier 606 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 606 fires.

When performing logical operations in this manner, the sense amplifier 606 can be pre-seeded with a data value from the dynamic latch of the accumulator to reduce overall current utilized because the sense amps 606 are not at full rail voltages (e.g., supply voltage or ground/reference voltage) when accumulator function is copied to the sense amplifier 606. An operation sequence with a pre-seeded sense amplifier 606 either forces one of the data lines to the reference voltage (leaving the complementary data line at $V_{DD}/2$, or leaves the complementary data lines unchanged. The sense amplifier 606 pulls the respective data lines to full rails when the sense amplifier 606 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 623 can be used for shifting data values stored in memory cells coupled to a particular pair of complementary data lines to the sensing circuitry 650 (e.g., sense amplifier 606) corresponding to a different pair of complementary data lines (e.g., such as a sense amplifier 606 corresponding to a left or right adjacent pair of complementary data lines. As used herein, a sense amplifier 606 corresponds to the pair of complementary data lines to which the sense amplifier is coupled when isolation transistors 621-1 and 621-2 are conducting. The SHIFT operations (right or left) do not pre-copy the Row X data value into the accumulator. Operations to shift right Row X can be summarized as follows:

Deactivate Norm and Activate Shift
Deactivate EQ
Enable Row X
Fire Sense Amps (after which shifted Row X data resides in the sense amps)
Activate Norm and Deactivate Shift
Disable Row X
Precharge In the pseudo code above, "Deactivate Norm and Activate Shift" indicates that a NORM control signal goes low causing isolation transistors 621-1 and 621-2 of the shift circuitry 623 to not conduct (e.g., isolate the sense amplifier from the corresponding pair of complementary data lines). The SHIFT control signal goes high causing isolation transistors 621-3 and 621-4 to conduct, thereby coupling the sense amplifier 606 to the left adjacent pair of complementary data lines (e.g., on the memory array side of non-conducting isolation transistors 621-1 and 621-2 for the left adjacent pair of complementary data lines).

After the shift circuitry 623 is configured, the "Deactivate EQ," "Enable Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 606.

In the pseudo code above, "Activate Norm and Deactivate Shift" indicates that a NORM control signal goes high causing isolation transistors 621-1 and 621-2 of the shift circuitry 623 to conduct (e.g., coupling the sense amplifier to the corresponding pair of complementary data lines), and the SHIFT control signal goes low causing isolation transistors 621-3 and 621-4 to not conduct and isolating the sense amplifier 606 from the left adjacent pair of complementary data lines (e.g., on the memory array side of non-conducting isolation transistors 621-1 and 621-2 for the left adjacent pair of complementary data lines). Since Row X is still active, the Row X data value that has been shifted right is transferred to Row X of the corresponding pair of complementary data lines through isolation transistors 621-1 and 621-2.

After the Row X data values are shifted right to the corresponding pair of complementary data lines, the selected row (e.g., ROW X) is disabled as indicated by "Disable Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

```
Activate Norm and Deactivate Shift
Deactivate EQ
Enable Row X
Fire Sense Amps (after which Row X data resides in the sense
amps)
Deactivate Norm and Activate Shift
    Sense amplifier data (shifted left Row X) is transferred to Row X
Disable Row X
Precharge
```

In the pseudo code above, "Activate Norm and Deactivate Shift" indicates that a NORM control signal goes high causing isolation transistors 621-1 and 621-2 of the shift circuitry 623 to conduct, and the SHIFT control signal goes low causing isolation transistors 621-3 and 621-4 to not conduct. This configuration couples the sense amplifier 606 to a corresponding pair of complementary data lines and isolates the sense amplifier from the right adjacent pair of complementary data lines.

After the shift circuitry is configured, the "Deactivate EQ," "Enable Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 650 is stored in the sense amplifier 606.

In the pseudo code above, "Deactivate Norm and Activate Shift" indicates that a NORM control signal goes low causing isolation transistors 621-1 and 621-2 of the shift circuitry 623 to not conduct (e.g., isolate the sense amplifier from the corresponding pair of complementary data lines), and the SHIFT control signal goes high causing isolation transistors 621-3 and 621-4 to conduct coupling the sense amplifier to the left adjacent pair of complementary data lines (e.g., on the memory array side of non-conducting isolation transistors 621-1 and 621-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Disable Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs simultaneously using data values in memory cells coupled to a data line (e.g., a column of 11K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Operation of the sensing circuitry 650 in the second mode (in which a result of the logical operation is initially stored in the compute component 631) is described in part above with respect to FIGS. 4-5 (above) and described in part below with respect to FIGS. 10-12. Operation of the sensing circuitry 650 in the second mode is similar to the operations described for the sensing circuitry 250 shown in FIG. 2 and illustrated in timing diagrams shown in FIGS. 4 and 5 with the caveat that the additional dynamic latch portion of the compute component 631 operates together with the state static latch 664 of the compute component 631.

FIG. 4 illustrates loading a data value to a sense amplifier and storing the data value in a compute component coupled to the sense amplifier as an initial phase of operation for a logical operation. Loading a data value to sense amplifier 606 and storing the data value in compute component 631 can be implemented in a similar manner by the sensing circuitry 650 shown in FIG. 6. The data value loaded into sense amplifier 606 and compute component 631 can be, for example, a first operand of a logical operation such as an AND or OR logical operation.

FIG. 5 illustrates inverting the data value in the compute component, which is one example intermediate operation phase of a logical operation (e.g., an R-input logical operation), and which can be followed by other logical operations or a last operation phase of the logical operation to store a resultant data value (e.g., described below with respect to FIG. 12). The invert logical operation, described with respect to compute component 250 shown in FIG. 2 and as illustrated in the timing diagram shown in FIG. 5, can be implemented in a similar manner using compute component 631 shown in FIG. 6. In addition, the sensing circuitry 650 can implement additional intermediate phases of logical operations such as AND and OR, as described below with respect to FIGS. 10 and 11, and can implement a last phase of a logical operation (e.g., to store a resultant data value) as described below with respect to FIG. 12.

Figure 10:
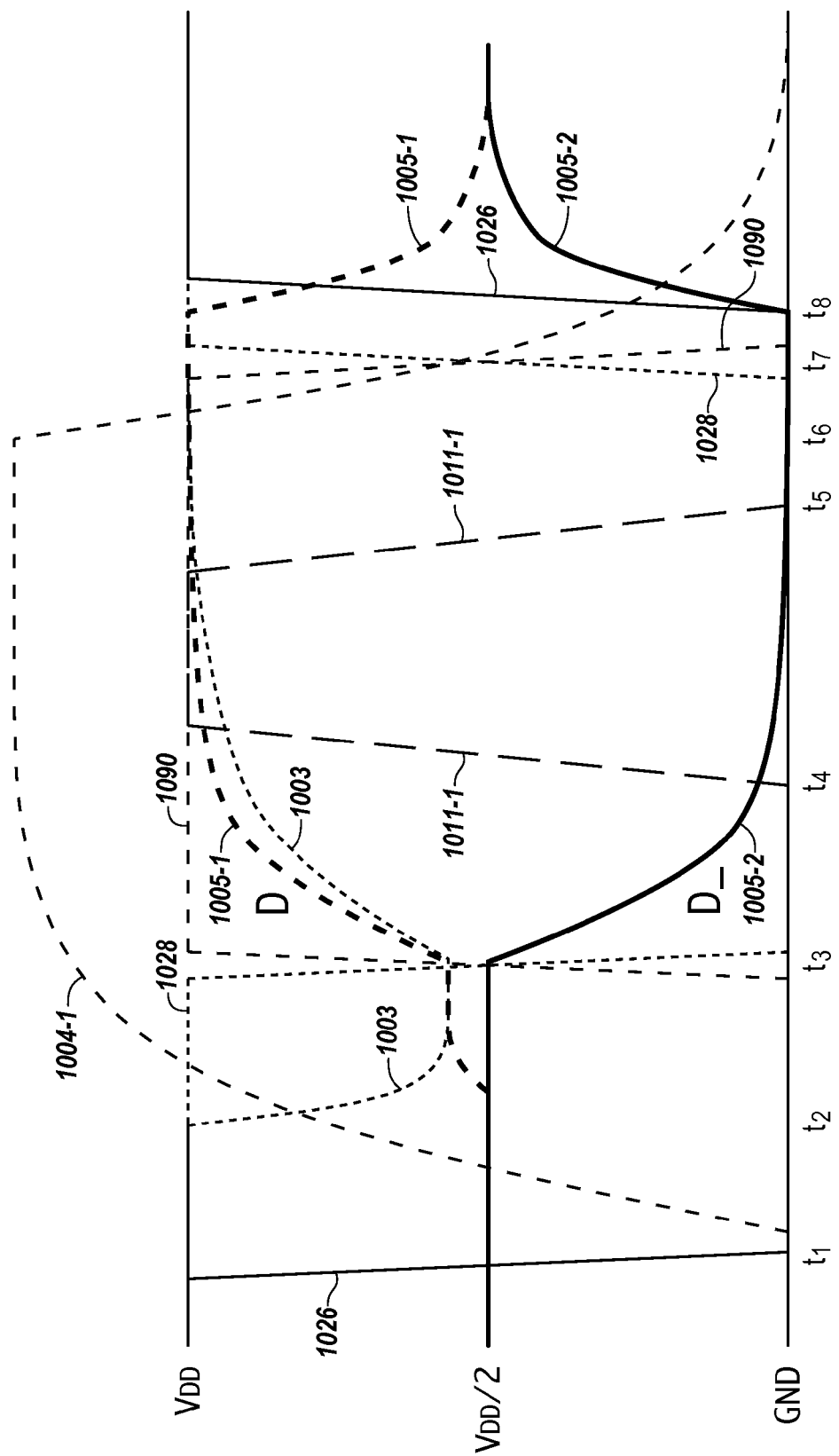
FIG. 10 illustrates a timing diagram associated with performing a number of logical operations using sensing circuitry in accordance with a number of embodiments of the present disclosure.
Figure 11:
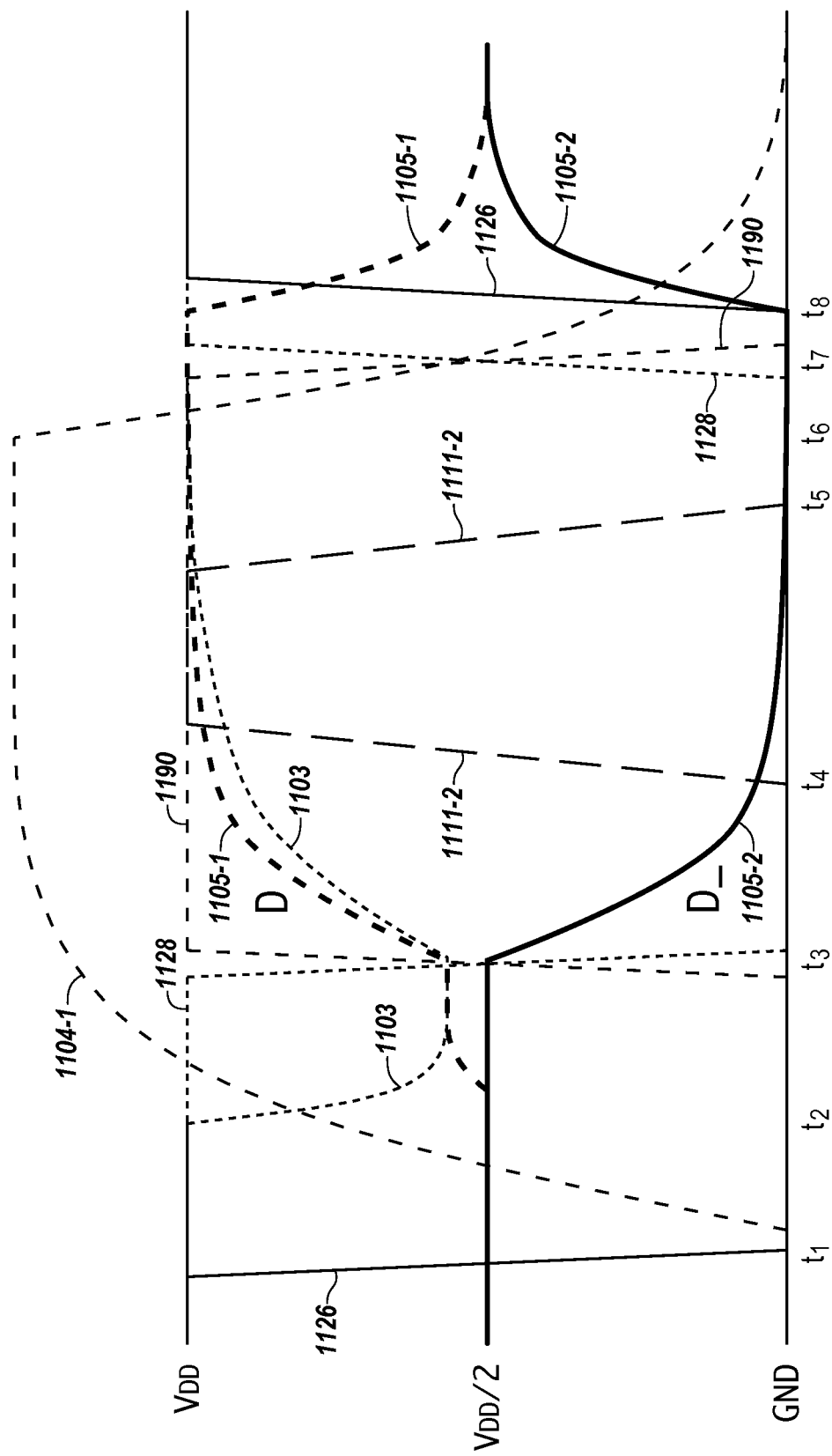
FIG. 11 illustrates a timing diagram associated with performing a number of logical operations using sensing circuitry in accordance with a number of embodiments of the present disclosure.

FIGS. 10 and 11 respectively illustrate timing diagrams associated with performing a number of logical operations using sensing circuitry in accordance with a number of embodiments of the present disclosure. Timing diagrams shown in FIGS. 10 and 11 illustrate signals (e.g., voltage signals) associated with performing a number of intermediate operation phases of a logical operation (e.g., an R-input logical operation). For instance, timing diagram shown in FIG. 10 corresponds to a number of intermediate operation phases of an R-input NAND operation or an R-input AND operation, and timing diagram shown in FIG. 11 corresponds to a number of intermediate operation phases of an R-input NOR operation or an R-input OR operation. For example, performing an AND or NAND operation can include performing the operation phase shown in FIG. 10 one or more times subsequent to an initial operation phase such as that described with respect to FIG. 14. Similarly, performing an OR or NOR operation can include performing the operation phase shown and described with respect to FIG. 11 one or more times subsequent to an initial operation phase such as that described with respect to FIG. 14.

As shown in the timing diagrams illustrated in FIGS. 10 and 11, at time $t_1$, equilibration is disabled (e.g., the equilibration signal 1026/1626 is deactivated), and then a selected row is enabled (e.g., the row corresponding to a memory cell whose data value is to be sensed and used as an input such as a second input, third input, etc.). Signal 1004-1/1604-1 represents the voltage signal applied to the selected row (e.g., Row Y 604-Y shown in FIG. 6). When row signal 1004-1 reaches the threshold voltage (Vt) of the access transistor (e.g., 602-1 shown in FIG. 6) corresponding to the selected cell, the access transistor turns on and couples the data line D to the selected memory cell (e.g., to the capacitor 603-1 if the cell is a 1T1C DRAM cell), which creates a differential voltage signal between the data lines D and D_ (e.g., as indicated by signals 1005-1/1605-1 and 1005-2/1605-2, respectively) between times $t_2$ and $t_3$. The voltage of the selected cell is represented by signal 1003/1603. Due to conservation of energy, creating the differential signal between D and D_ (e.g., by coupling the cell to data line D) does not consume energy, since the energy associated with activating/deactivating the row signal 1004-1/1604-1 can be amortized over the plurality of memory cells coupled to the row.

At time $t_3$, the sense amplifier (e.g., 606 shown in FIG. 6) is enabled (e.g., a positive control signal 1090/1690 (e.g., corresponding to ACT 733 shown in FIG. 7) goes high, and the negative control signal 1028/1628 (e.g., RnIF 728 shown in FIG. 7) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_), such that the sensed data value is stored in the primary latch of sense amplifier 606. The primary energy consumption occurs in charging the data line D (1305-1) from the equilibration voltage $V_{DD}/2$ to the rail voltage $V_{DD}$.

As shown in timing diagrams illustrated in FIGS. 10 and 11, at time $t_4$ (e.g., after the selected cell is sensed), only one of control signals 1011-1 (Passd) shown in FIGS. 10 and 1111-2 (Passdb) shown in FIG. 11 is activated (e.g., only one of pass transistors (if present) is enabled), depending on the particular logic operation. For example, since the timing diagram illustrated in FIG. 10 corresponds to an intermediate phase of a NAND or AND operation, control signal 1011-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 11 corresponds to an intermediate phase of a NOR or OR operation, control signal 1111-2 (Passdb) is activated at time t4 to turn on the pass transistor coupling the primary latch to data line D_ and control signal Passd remains deactivated leaving the pass transistor coupling the primary latch to data line D turned off Recall from above that the accumulator control signals 1412-1 (Accumb) and 1412-2 (Accum) were activated during the initial operation phase described with respect to FIG. 14, and they remain activated during the intermediate operation phase(s).

Since the accumulator was previously enabled, activating only Passd (1511-1 as shown in FIG. 10) results in accumulating the data value corresponding to the voltage signal 1005-1 shown in FIG. 10 corresponding to data line D. Similarly, activating only Passdb (1611-2 as shown in FIG. 11) results in accumulating the data value corresponding to the voltage signal 1105-2 corresponding to data line D_. For instance, in an example AND/NAND operation shown in the timing diagram illustrated in FIG. 10 in which only Passd (1511-1) is activated, if the data value stored in the second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 11 in which only Passdb 1111-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 1105-2 on D_ is setting the true data value of the accumulator.

At the conclusion of an intermediate operation phase such as that shown in FIG. 10 or 11, the Passd signal 1011-1 (e.g., for AND/NAND) or the Passdb signal 1111-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 10 or 11 can be repeated in order to accumulate results from a number of additional rows. As an example, the sequence of timing diagram illustrated in FIG. 10 and/or 11 can be performed a subsequent (e.g., second) time for a third memory cell, a subsequent (e.g., third) time for a fourth memory cell, etc. For instance, for a 10-input NOR operation, the intermediate phase shown in FIG. 11 can occur 9 times to provide 9 inputs of the 10-input logical operation, with the tenth input being determined during the initial operation phase (e.g., as described with respect to FIG. 14).

Figure 12:
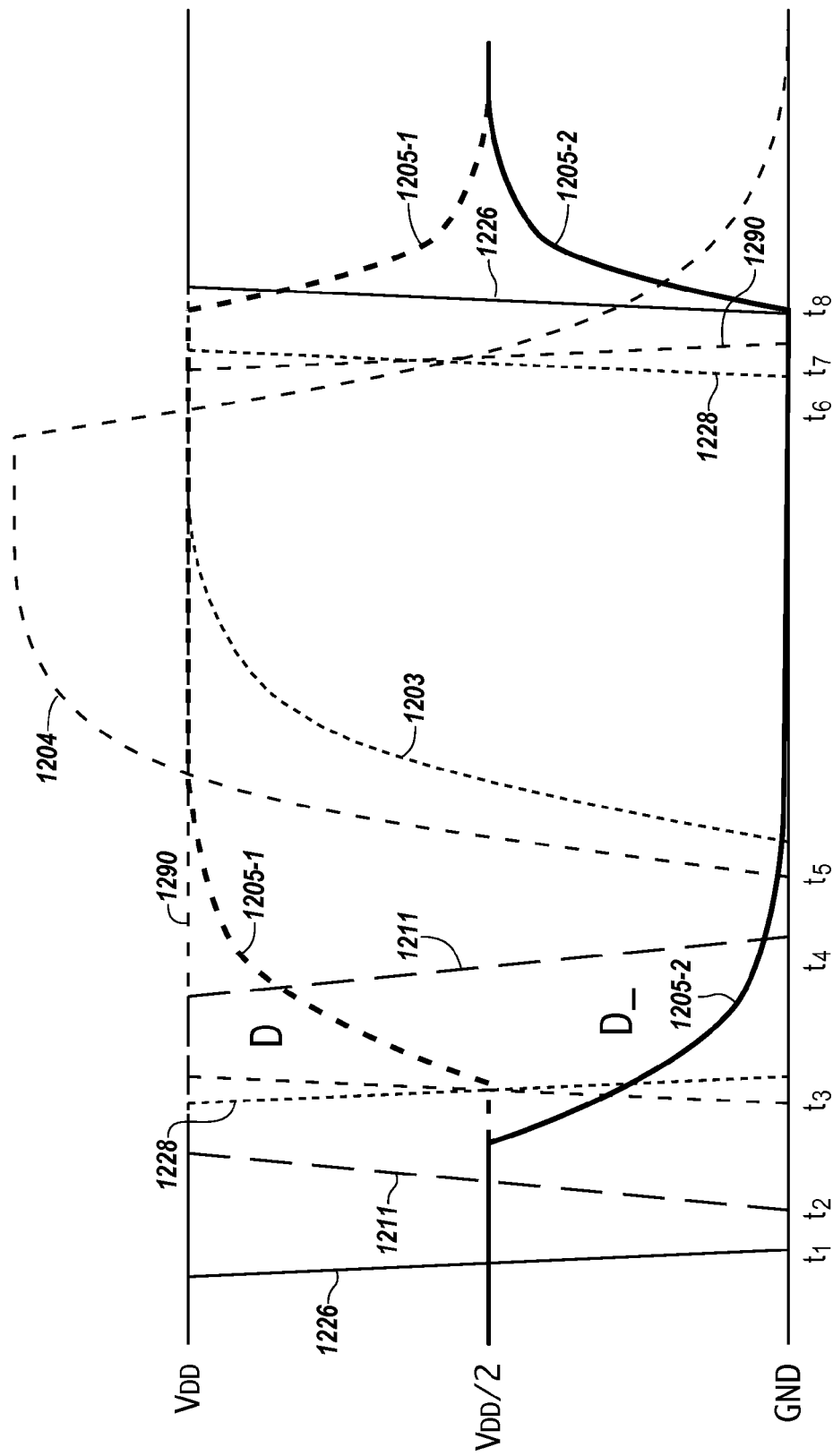
FIG. 12 illustrates a timing diagram associated with performing a number of logical operations using sensing circuitry in accordance with a number of embodiments of the present disclosure.

FIG. 12 illustrates a timing diagram associated with performing a number of logical operations using sensing circuitry in accordance with a number of embodiments of the present disclosure. The timing diagram illustrated in FIG. 12 shows signals (e.g., voltage signals) associated with performing a last operation phase of a logical operation (e.g., an R-input logical operation). For instance, the timing diagram illustrated in FIG. 12 corresponds to a last operation phase of an R-input AND operation or an R-input OR operation or NOT operation, among others.

For example, performing a last operation phase of an R-input can include performing the operation phase shown in FIG. 12 subsequent to a number of iterations of the intermediate operation phase(s) described in association with FIGS. 10 and/or 11. Table 2 shown below indicates the Figures corresponding to the sequence of operation phases associated with performing a number of R-input logical operations in accordance with a number of embodiments described herein.

TABLE 2

Figure 14:
FIG. 14 is a logic table illustrating selectable logic operation results implemented by a sensing circuitry in accordance with a number of embodiments of the present disclosure.

| Operation | FIG. 14 | FIG. 10 | FIG. 11 | FIG. 12 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 12 is described in association with storing a result of an R-input logical operation to a row of the array (e.g., array 630 shown in FIG. 6). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 12, at time t$_1$, equilibration is disabled (e.g., the equilibration signal 1226 is deactivated) such that data lines D and D_ are floating. At time t2, the Passd control signal 1211 (and Passdb signal) is activated for an AND or OR operation.

Activating the Passd control signal 1211 (and Passdb signal) (e.g., in association with an AND or OR operation) transfers the accumulated output stored in the secondary latch of compute component 631-6 shown in FIG. 6 to the primary latch of sense amplifier 606. For instance, for an AND operation, if any of the memory cells sensed in the prior operation phases (e.g., the first operation phase illustrated in FIG. 14 and one or more iterations of the intermediate operation phase illustrated in FIG. 10) stored a logic "0" (e.g., if any of the R-inputs of the AND operation were a logic "0"), then the data line D_ will carry a voltage corresponding to logic "1" (e.g., V$_{DD}$) and data line D will carry a voltage corresponding to logic "0" (e.g., ground).

For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 606 is then enabled (e.g., a positive control signal 1290 (e.g., corresponding to ACT 790 shown in FIG. 7) goes high and the negative control signal 1228 (e.g., corresponding to RnIF 728 shown in FIG. 7) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at V$_{DD}$ if all of the input data values are a logic "1."

For an OR operation, if any of the memory cells sensed in the prior operation phases (e.g., the first operation phase of FIG. 14 and one or more iterations of the intermediate operation phase shown in FIG. 11) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., V$_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 606 is then enabled and the data line D now carries the ORed result of the respective input data values as determined from the memory cells sensed during the prior operation phases. As such, data line D will be at V$_{DD}$ if any of the input data values are a logic "1" and data line D will be at ground if all of the input data values are a logic "0."

The result of the R-input AND or OR logical operations can then be stored back to a memory cell of array 1230 shown in FIG. 6. In the examples shown in FIG. 12, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 12 show, at time t3, the positive control signal 1290 and the negative control signal 1228 being deactivated (e.g., signal 1290 goes high and signal 1228 goes low) to disable the sense amplifier 606 shown in FIG. 6. At time t4 the Passd control signal 1211 (and Passdb signal) that was activated at time t2 is deactivated. Embodiments are not limited to this example. For instance, in a number of embodiments, the sense amplifier 606 shown in FIG. 6 may be enabled subsequent to time t4 (e.g., after he Passd control signal 1211 (and Passdb signal) are deactivated).

As shown in FIG. 12, at time t5, a selected row is enabled (e.g., by row activation signal 1204 going high, which drives the capacitor of the selected cell to the voltage corresponding to the logic value stored in the accumulator. At time t6 the selected row is disabled. At time t7 the sense amplifier 606 shown in FIG. 6 is disabled (e.g., positive control signal 1228 and negative control signal 1290 are deactivated), and at time t8 equilibration occurs (e.g., signal 1226 is activated and the voltages on the complementary data lines 1205-1 (D) and 1205-2 (D_) are brought to the equilibration voltage).

Although the example of performing a last operation phase of an R-input was discussed above with respect to FIG. 12 for performing AND and OR logical operations, embodiments are not limited to these logical operations. For example, the NAND and NOR operations can also involve a last operation phase of an R-input that is stored back to a memory cell of array 630 using control signals to operate the sensing circuitry illustrated in FIG. 6.

Figure 13:
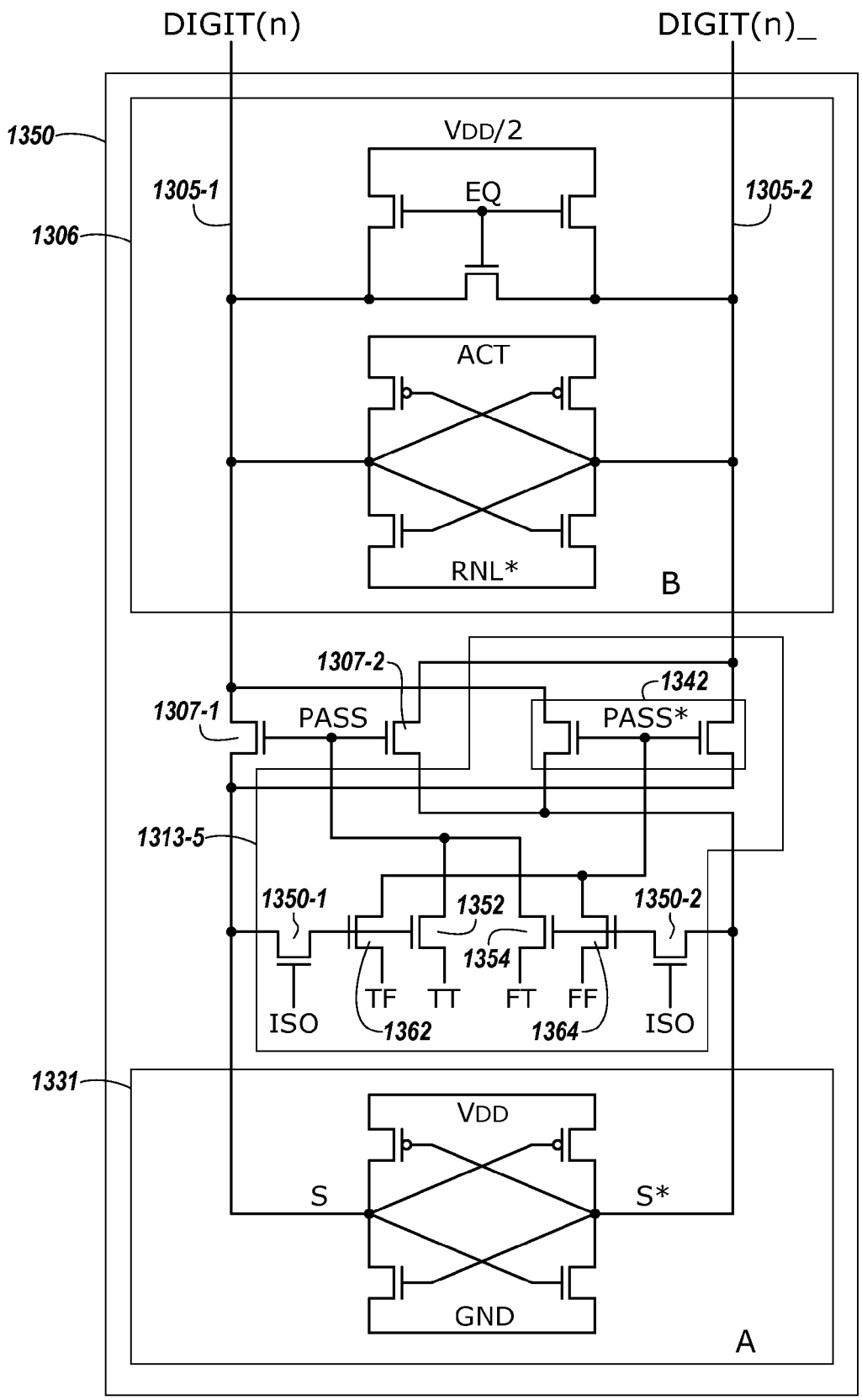
FIG. 13 is a schematic diagram illustrating sensing circuitry having selectable logical operation selection logic in accordance with a number of embodiments of the present disclosure.

FIG. 13 is a schematic diagram illustrating sensing circuitry having selectable logical operation selection logic in accordance with a number of embodiments of the present disclosure. FIG. 13 shows a sense amplifier 1306 coupled to a pair of complementary sense lines 1305-1 and 1305-2, and a compute component 1331 coupled to the sense amplifier 1306 via pass gates 1307-1 and 1307-2. The gates of the pass gates 1307-1 and 1307-2 can be controlled by a logical operation selection logic signal, PASS, which can be output from logical operation selection logic 1313-5. FIG. 13 shows the compute component 1331 labeled "A" and the sense amplifier 1306 labeled "B" to indicate that the data value stored in the compute component 1331 is the "A" data value and the data value stored in the sense amplifier 1306 is the "B" data value shown in the logic tables illustrated with respect to FIG. 14.

The sensing circuitry 1350 illustrated in FIG. 13 includes logical operation selection logic 1313-5. In this example, the logic 1313-5 comprises swap gates 1342 controlled by a logical operation selection logic signal PASS*. The logical operation selection logic 1313-5 also comprises four logic selection transistors: logic selection transistor 1362 coupled between the gates of the swap transistors 1342 and a TF signal control line, logic selection transistor 1352 coupled between the gates of the pass gates 1307-1 and 1307-2 and a TT signal control line, logic selection transistor 1354 coupled between the gates of the pass gates 1307-1 and 1307-2 and a FT signal control line, and logic selection transistor 1364 coupled between the gates of the swap transistors 1342 and a FF signal control line. Gates of logic selection transistors 1362 and 1352 are coupled to the true sense line (e.g., 1305-1) through isolation transistor 1350-1 (having a gate coupled to an ISO signal control line), and gates of logic selection transistors 1364 and 1354 are coupled to the complementary sense line (e.g., 1305-2) through isolation transistor 1350-2 (also having a gate coupled to an ISO signal control line).

Logic selection transistors 1352 and 1354 are arranged similarly to transistor 693-1 (coupled to an AND signal control line) and transistor 693-2 (coupled to an OR signal control line) respectively, as shown in FIG. 6. Operation of logic selection transistors 1352 and 1354 are similar based on the state of the TT and FT selection signals and the data values on the respective complementary sense lines at the time the ISO signal is asserted. Logic selection transistors 1362 and 1364 also operate in a similar manner to control continuity of the swap transistors 1342. That is, to enable (e.g., turn on) the swap transistors 1342, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 1342 will not be enabled by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines together, which may be a disruptive configuration to be avoided. Logical operations results for the sensing circuitry illustrated in FIG. 13 are summarized in the logic table illustrated in FIG. 14.

FIG. 10 is a logic table illustrating selectable logic operation results implementable by the sensing circuitry shown in FIG. 13 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 1306 and compute component 1331. The four control signals, in conjunction with a particular data value present on the complementary sense lines, controls the continuity of the pass gates 1307-1 and 1307-2 and swap transistors 1342, which in turn affects the data value in the compute component 1331 and/or sense amplifier 1306 before/after firing. The capability to selectably control continuity of the swap transistors 1342 facilitates implementing logical operations involving inverse data values (e.g., inverse operands and/or inverse result), among others.

The logic table illustrated in FIG. 14 shows the starting data value stored in the compute component 1331 shown in column A at 1444, and the starting data value stored in the sense amplifier 1306 shown in column B at 1445. The other 3 top column headings (NOT OPEN, OPEN TRUE, and OPEN INVERT) in the logic table of FIG. 14 refer to the continuity of the pass gates 1307-1 and 1307-2, and the swap transistors 1342, which can respectively be controlled to be OPEN or CLOSED depending on the state of the four logic selection control signals (e.g., TF, TT, FT, and FF), in conjunction with a particular data value present on the pair of complementary sense lines 1305-1 and 1305-2 when the ISO control signal is asserted. The "Not Open" column corresponds to the pass gates 1307-1 and 1307-2 and the swap transistors 1342 both being in a non-conducting condition, the "Open True" corresponds to the pass gates 1307-1 and 1307-2 being in a conducting condition, and the "Open Invert" corresponds to the swap transistors 1342 being in a conducting condition. The configuration corresponding to the pass gates 1307-1 and 1307-2 and the swap transistors 1342 both being in a conducting condition is not reflected in the logic table of FIG. 14 since this results in the sense lines being shorted together.

Via selective control of the continuity of the pass gates 1307-1 and 1307-2 and the swap transistors 1342, each of the three columns of the first set of two rows of the upper portion of the logic table of FIG. 14 can be combined with each of the three columns of the second set of two rows below the first set to provide 3×3=9 different result combinations, corresponding to nine different logical operations, as indicated by the various connecting paths shown at 1475. The nine different selectable logical operations that can be implemented by the sensing circuitry 1350 are summarized in the logic table illustrated in FIG. 13.

The columns of the lower portion of the logic table illustrated in FIG. 14 show a heading 1480 that includes the state of logic selection control signals. For example, the state of a first logic selection control signal is provided in row 1476, the state of a second logic selection control signal is provided in row 1477, the state of a third logic selection control signal is provided in row 1478, and the state of a fourth logic selection control signal is provided in row 1479. The particular logical operation corresponding to the results is summarized in row 1447.

As such, the sensing circuitry shown in FIG. 13 can be used to perform various logical operations as shown in FIG. 14. For example, the sensing circuitry 1350 can be operated to perform various logical operations (e.g., AND and OR logical operations) in association with comparing data patterns in memory in accordance with a number of embodiments of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells;
   a plurality of data lines coupled to a plurality of columns of memory cells of the array;
   sensing circuitry coupled to the array, wherein the sensing circuitry includes:
      a compute component coupled to a complementary pair of the plurality of data lines corresponding to a particular one of the plurality of columns, wherein the compute component comprises a latch; and
      a sense amplifier corresponding and coupled to the compute component and the complementary pair of the plurality of data lines, wherein the sense amplifier comprises a different latch; and
   wherein the sensing circuitry is controlled to invert a data value stored in the latch of the compute component by:
   placing an inverse of the data value on the complementary pair of the plurality of data lines;
   disabling the latch of the compute component;
      while the latch of the compute component is disabled, enabling the sense amplifier to store the inverse of the data value in the different latch; and
      while the sense amplifier is enabled:
         enabling a pass transistor; and
         while the pass transistor is enabled, enabling the latch of the compute component such that the inverse of the data value is stored therein.

2. The apparatus of claim 1, wherein the compute component comprises an accumulator.

3. The apparatus of claim 2, wherein the accumulator comprises the latch.

4. The apparatus of claim 3, wherein the latch comprises a first pair of transistors and a second pair of transistors formed on pitch with memory cells of the array.

5. The apparatus of claim 1, wherein the apparatus is further configured to store the inverted data value in the sense amplifier while the array is isolated from the sensing circuitry.

6. The apparatus of claim 1, wherein the sensing circuitry is coupled to the array through an isolation device.

7. The apparatus of claim 6, wherein the sensing circuitry is coupled to a second array through the isolation device, the isolation device being configured such that at most one of the array and the second array are connected to the sensing circuitry at once.

8. The apparatus of claim 7, wherein the isolation device is further configured such that the array and the second array can both be simultaneously disconnected from the sensing circuitry.

9. The apparatus of claim 1, wherein the sense amplifier is coupled to the array through an isolation device.

10. A method for performing an invert operation, comprising:
    storing a plurality of data values in a plurality of columns of memory cells;
    storing a particular data value of the plurality of data values in a compute component coupled to a sense amplifier, wherein the compute component and the sense amplifier correspond to a particular one of the plurality of columns of memory cells, wherein the compute component is coupled to a pair of complementary data lines corresponding to the particular one of the plurality of columns of memory cells and comprises a latch; and inverting the particular data value stored in the latch by:
enabling a pair of inverting transistors to place an inverse of the particular data value on the pair of complementary data lines corresponding to the particular one of the plurality of columns, wherein a source/drain region of each of the pair of inverting transistors are coupled to a respective one of the pair of complementary data lines and gates of the pair of inverting transistors are coupled to an inversion signal control line;
subsequently disabling the pair of inverting transistors;
disabling the latch of the compute component, and while the latch of the compute component is disabled, enabling the sense amplifier to store the inverse of the particular data value therein;
enabling a pair of pass transistors coupled between an input node of the sense amplifier and an input node of the latch;
while the pair of pass transistors are enabled, enabling the latch of the compute component to transfer the inverse of the particular data value from the sense amplifier to the latch of the compute component, and
wherein the invert operation is performed without activating an access line of a memory array coupled to the sense amplifier, and without writing the inverted data value to a memory cell of the particular one of the plurality of columns of memory cells.

11. The method of claim 10, wherein inverting the particular data value in the latch is accomplished without performing an address access of a data line of the memory array.

12. An apparatus, comprising:
an array of memory cells comprising a plurality of columns of memory cells corresponding to a respective plurality of pairs of complementary data lines; and
sensing circuitry coupled to the array of memory cells via the pairs of complementary data lines, wherein the sensing circuitry includes a sense amplifier coupled to a compute component per column of the array,
wherein the compute component and the sense amplifier per respective column are coupled to a particular pair of complementary data lines, wherein the compute component comprises:
a latch; and
a pair of inverting transistors, wherein a source/drain region of each of the pair of inverting transistors are coupled to a respective one of the particular pair of complementary data lines and gates of the pair of inverting transistors are coupled to an inversion signal control line, and
wherein the sensing circuitry is controlled to:
load, to the sense amplifier coupled to one of the pairs of complementary data lines, a data value;
store the data value in the compute component coupled to the sense amplifier; and
invert the data value stored in the compute component by:
while a pair of pass transistors coupled between the sense amplifier and the compute component are disabled:
enabling the pair of inverting transistors to place an inverse of the data value on the particular pair of complementary data lines;
disabling the latch of the compute component; and
while the latch of the compute component is disabled, enabling the sense amplifier such that the inverse of the data value resides in the sense amplifier;
enabling the pair of pass transistors to couple an input node of the sense amplifier to an input node of the latch of the compute component; and
while the pair of pass transistors are enabled, enabling the latch of the compute component to transfer the inverse of the data value from the sense amplifier to the latch of the compute component, thereby inverting the data value stored in the latch of the compute component without performing an address access of the array.

13. The apparatus of claim 12, wherein the sensing circuitry is further configured to invert the data value in the latch without activating an I/O line coupled to the sense amplifier.

14. The apparatus of claim 12, wherein the sensing circuitry is further configured to:
store a second data value from a second array of memory cells in the compute component; and
invert the second data value in the latch.

15. A method for performing an invert operation, comprising:
storing a plurality of data values in a plurality of columns of memory cells;
storing a particular data value of the plurality of data values in a compute component coupled to a sense amplifier, wherein the compute component and the sense amplifier correspond to a particular one of the plurality of columns of memory cells via a pair of complementary data lines, wherein the compute component comprises a latch;
inverting the particular data value stored in the latch by:
while a pair of pass transistors coupled between the sense amplifier and the compute component are disabled:
enabling a pair of inverting transistors to place an inverse of the particular data value on the pair of complementary data lines, wherein a source/drain region of each of the pair of inverting transistors are coupled to a respective one of the pair of complementary data lines and to a respective first source/drain region of one of the pair of pass transistors, and second source/drain regions of the pair of pass transistors are coupled to the latch of the compute component;
subsequently to disabling the pair of inverting transistors, disabling the latch of the compute component; and
while the latch of the compute component is disabled, enabling the sense amplifier such that the inverse of the particular data value resides in the sense amplifier;
enabling the pair of pass transistors to couple an input node of the sense amplifier to an input node of the latch of the compute component; and
while the pair of pass transistors are enabled, enabling the latch of the compute component to transfer the inverse of the particular data value from the sense amplifier to the latch through the pair of pass transistors.

16. The method of claim 15, further comprising operating a number of isolation transistors to couple the sense amplifier to a pair of complementary data lines of a first memory array and to isolate the sense amplifier from a pair of complementary data lines of a second memory array prior to inverting the particular data value to the inverted data value, wherein inverting the particular data value in the latch inverts the particular data value on the pair of complementary data lines of the first memory array.

17. The method of claim 15, further comprising operating a number of isolation transistors to isolate the sense amplifier from a pair of complementary data lines of a first memory array and a pair of complementary data lines of a second memory array prior to inverting the particular data value, wherein inverting the particular data value in the latch does not invert the particular data value on the pair of complementary data lines of the first memory array and the second memory array.

18. The method of claim 15, further comprising storing the inverted data value in the latch.

19. The method of claim 15, wherein inverting the particular data value is accomplished without amplifying a data line of the pair of complementary data lines coupled to the compute component through an isolation device.

20. The method of claim 19, wherein inverting the particular data value is accomplished without amplification of the complementary pair of data lines.

21. The method of claim 15, wherein the particular data value is inverted and the inverted data value is stored in the sense amplifier without activating an access line coupled to memory cells in a memory array coupled to the sense amplifier.

\* \* \* \* \*